United States Patent
Wang et al.

(10) Patent No.: US 12,469,669 B2
(45) Date of Patent: Nov. 11, 2025

(54) PRINTED CIRCUIT BOARD FOR SEALING VACUUM SYSTEM

(71) Applicant: ASML Netherlands B.V., Veldhoven (NL)

(72) Inventors: Yongxin Wang, San Ramon, CA (US); Rui-Ling Lai, San Jose, CA (US); Nickolay Stepanenko, Helmond (NL); Jan Bex, Overpelt (BE); Ronny Hendrix, Velden (NL); Lidewij Elisa Cornelissen, Eindhoven (NL); Robert Anton Brookhuis, Eindhoven (NL)

(73) Assignee: ASML Netherlands B.V., Veldhoven (NL)

(*) Notice: Subject to any disclaimer, the term of this patent is extended or adjusted under 35 U.S.C. 154(b) by 685 days.

(21) Appl. No.: 17/408,267

(22) Filed: Aug. 20, 2021

(65) Prior Publication Data

US 2022/0059311 A1   Feb. 24, 2022

Related U.S. Application Data

(60) Provisional application No. 63/184,067, filed on May 4, 2021, provisional application No. 63/068,880, filed on Aug. 21, 2020.

(51) Int. Cl.
*H01J 37/16* (2006.01)
*H05K 1/02* (2006.01)
(Continued)

(52) U.S. Cl.
CPC ............ *H01J 37/16* (2013.01); *H05K 1/0201* (2013.01); *H05K 1/0298* (2013.01);
(Continued)

(58) Field of Classification Search
CPC .... H01J 37/16; H01J 37/244; H01J 2237/166; H01J 2237/182; H05K 1/0201;
(Continued)

(56) References Cited

U.S. PATENT DOCUMENTS

| 6,242,748 B1 | 6/2001 | Gallagher et al. |
| 2008/0121801 A1 | 5/2008 | Howard et al. |

(Continued)

FOREIGN PATENT DOCUMENTS

| CN | 105546638 A | 5/2016 | |
| EP | 2734018 A1 * | 5/2014 | .......... H01J 49/0004 |

(Continued)

OTHER PUBLICATIONS

International Search Report issued in related International Application No. PCT/EP2021/072129; mailed Dec. 7, 2021 (12 pgs.).
(Continued)

*Primary Examiner* — Mark R Gaworecki
(74) *Attorney, Agent, or Firm* — FINNEGAN, HENDERSON, FARABOW, GARRETT & DUNNER LLP

(57) ABSTRACT

Detector modules, systems and methods for detecting signal beams are disclosed using a detector module and a support comprising a feedthrough.
Furthermore, apparatuses, systems, and methods for sealing a vacuum system configured to provide an atmospheric environment and a vacuum chamber environment are disclosed. In some embodiments, a printed circuit board (PCB) comprising a first side for exposing to the atmospheric environment and a second side for exposing to the vacuum chamber environment and for covering an aperture in the vacuum chamber environment, wherein the second side is opposite to the first side. The apparatuses, systems, and methods may include a rigid body on the first side of the
(Continued)

PCB and a device connected to the second side of the PCB and positioned on a portion of the PCB that covers the aperture. The PCB may be configured to provide an interface between the device and the rigid body.

18 Claims, 12 Drawing Sheets

(51) Int. Cl.
  *H05K 1/03* (2006.01)
  *H01J 37/244* (2006.01)

(52) U.S. Cl.
  CPC .......... *H05K 1/0306* (2013.01); *H01J 37/244* (2013.01); *H01J 2237/166* (2013.01); *H01J 2237/182* (2013.01); *H05K 1/0209* (2013.01); *H05K 1/0271* (2013.01); *H05K 2201/064* (2013.01); *H05K 2201/068* (2013.01); *H05K 2201/10151* (2013.01)

(58) Field of Classification Search
  CPC .. H05K 1/0209; H05K 1/0271; H05K 1/0298; H05K 1/0306; H05K 2201/064; H05K 2201/068; H05K 2201/10151
  See application file for complete search history.

(56) References Cited

U.S. PATENT DOCUMENTS

| | | | |
|---|---|---|---|
| 2010/0032576 A1 | 2/2010 | Mooney et al. | |
| 2015/0348766 A1 | 12/2015 | Spaanderdam et al. | |
| 2016/0086787 A1 | 3/2016 | Heeren et al. | |
| 2020/0214157 A1* | 7/2020 | Solomon | H05K 5/0069 |
| 2020/0357600 A1 | 11/2020 | Zeidler et al. | |

FOREIGN PATENT DOCUMENTS

| | | | |
|---|---|---|---|
| JP | 2003506848 A | 2/2003 | |
| JP | 2003323861 A | 11/2003 | |
| JP | 2006516802 A | 7/2006 | |
| JP | 2016-100310 A | 5/2016 | |
| JP | 2016524781 A | 8/2016 | |
| JP | 2019019561 A | 2/2019 | |
| TW | 201530602 A | 8/2015 | |
| TW | 201834337 A | 9/2018 | |
| WO | 2014174048 A1 | 10/2014 | |
| WO | 2018051595 A1 | 3/2018 | |
| WO | WO 2020/076588 A1 | 4/2020 | |

OTHER PUBLICATIONS

Office Action of the Intellectual Property Office issued in related Taiwanese Patent Application No. 110130577; mailed May 6, 2022 (14 pgs.).

* cited by examiner

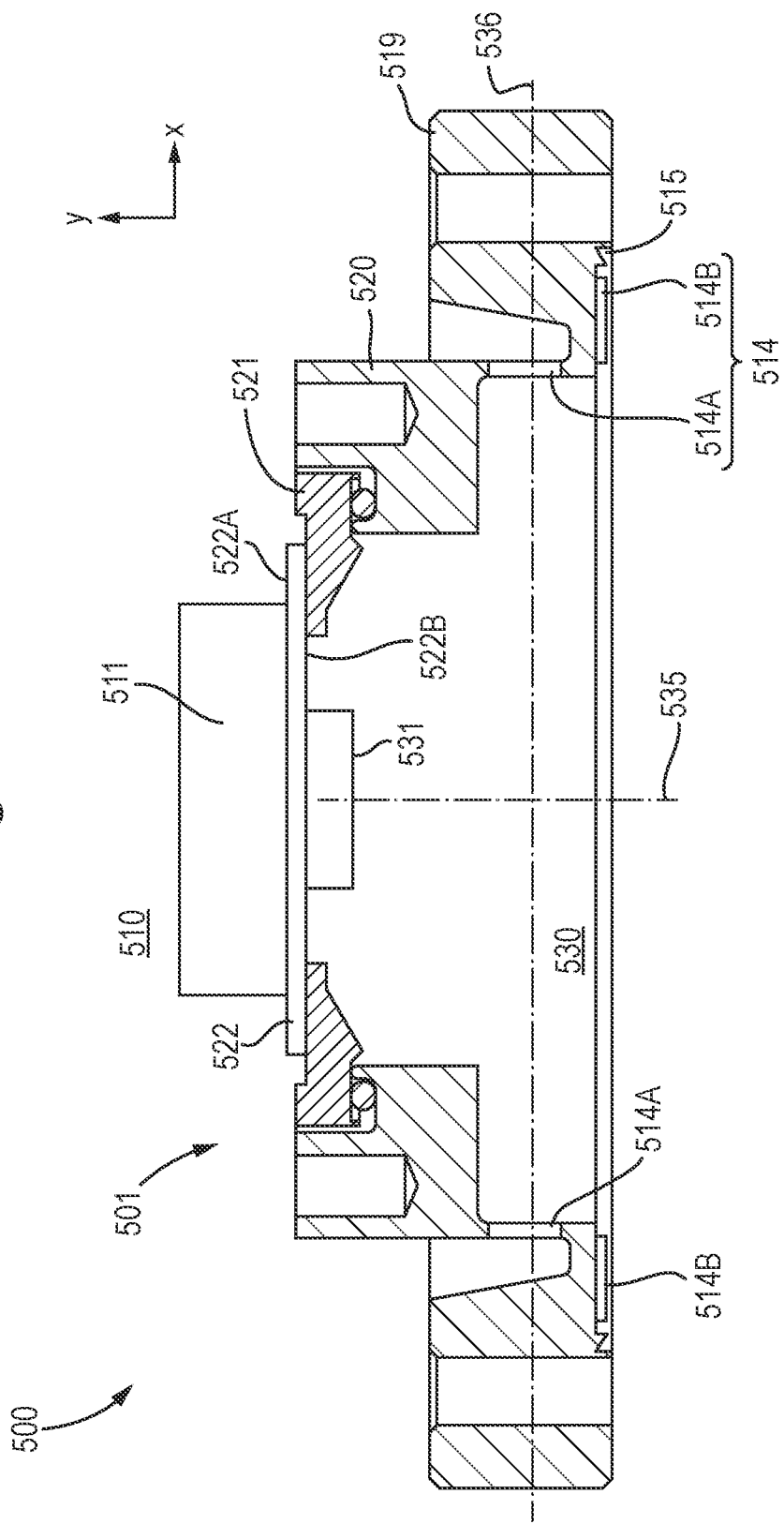

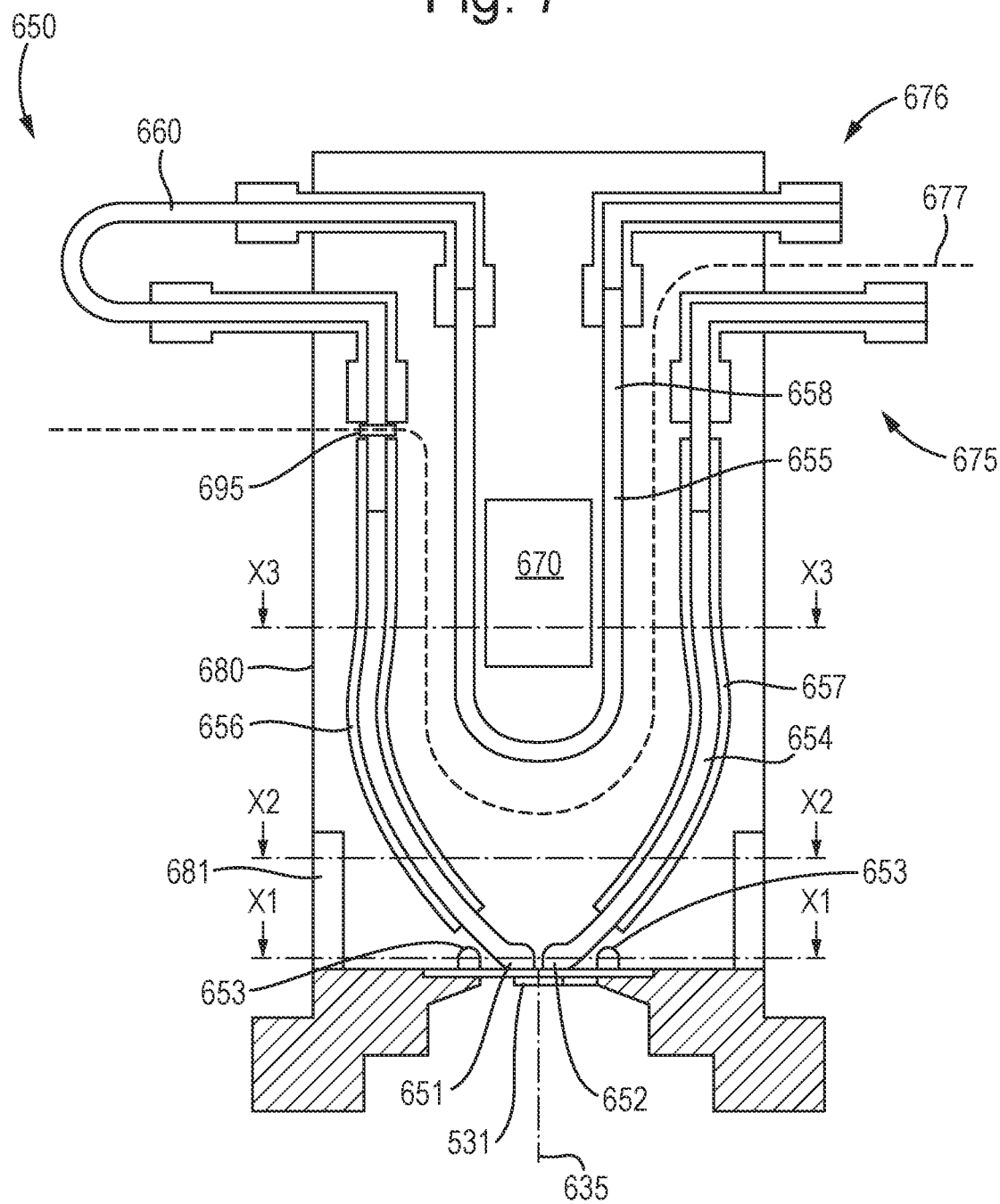

though; a thermal conditioning system comprising a support thermal conditioning section configured to thermally condition the support and a further thermal conditioning section configured to thermally condition another part of the detector module; and a separable portion comprising the other part and the further thermal conditioning section, wherein the

PRINTED CIRCUIT BOARD FOR SEALING VACUUM SYSTEM

CLAIM FOR PRIORITY

This application claims the priority of U.S. provisional application No. 63/068,880, filed Aug. 21, 2020, and U.S. provisional application No. 63/184,067, filed May 4, 2021, both of which are incorporated herein by reference in their entireties.

FIELD

The description herein relates to the field of detector modules, and more particularly to detector modules which can be used to define at least part of a wall of a vacuum chamber of an assessment tool. Furthermore, the description herein relates to the field of charged particle beam systems, and more particularly to systems for sealing vacuum systems using a printed circuit board in charged particle beam inspection systems.

BACKGROUND

In manufacturing processes of integrated circuits (ICs), unfinished or finished circuit components are inspected to ensure that they are manufactured according to design and are free of defects. An inspection system utilizing an optical microscope typically has resolution down to a few hundred nanometers; and the resolution is limited by the wavelength of light. As the physical sizes of IC components continue to reduce down to sub-100 or even sub-10 nanometers, inspection systems capable of higher resolution than those utilizing optical microscopes are needed.

A charged particle (e.g., electron) beam microscope, such as a scanning electron microscope (SEM) or a transmission electron microscope (TEM), capable of resolution down to less than a nanometer, serves as a practicable tool for inspecting IC components having a feature size that is sub-100 nanometers. With a SEM, electrons of a single primary electron beam, or electrons of a plurality of primary electron beams, can be focused at locations of interest of a wafer under inspection. The primary electrons interact with the wafer and may be backscattered or may cause the wafer to emit secondary electrons. The intensity of the electron beams comprising the backscattered electrons and the secondary electrons may vary based on the properties of the internal and external structures of the wafer, and thereby may indicate whether the wafer has defects.

SUMMARY

According to some aspects of the present disclosure, there is provided a detector module for defining at least a part of a wall of a vacuum chamber of a charged particle beam assessment tool, the detector module comprising: a detector configured to operate in the vacuum chamber, the detector being configured to be alignable with an incidental charged particle beam path; and a support for defining at least a part of the wall of the vacuum chamber, the support comprising a feedthrough to which the detector is mounted, wherein the detector is electrically connected through the feedthrough, wherein applied disturbances deform the support; wherein the detector module is configured so that, with disturbances to the detector and/or support, the position of the detector during operation of the detector is maintained relative to the incidental charged particle beam path.

According to some aspects of the present disclosure, there is provided a detector module for defining at least a part of a wall of a vacuum chamber of a charged particle beam assessment tool, the module comprising: a detector configured to operate in the vacuum chamber, the detector being configured to be alignable with an incidental charged particle beam path; a support for defining at least a part of the wall of the vacuum chamber, the support comprising a feedthrough to which the detector is mounted, wherein the detector is electrically connected through the feedthrough; a thermal conditioning system comprising a support thermal conditioning section configured to thermally condition the support and a further thermal conditioning section configured to thermally condition another part of the detector module; and a separable portion comprising the other part and the further thermal conditioning section, wherein the separable portion is configured to be removable from the detector module.

According to some aspects of the present disclosure, there is provided a detector module for defining at least a part of a wall of a vacuum chamber of a charged particle beam assessment tool, the module comprising: a detector configured to operate in the vacuum chamber, the detector being configured to be alignable with an incidental charged particle beam path; a support for defining at least a part of the wall of the vacuum chamber, the support comprising a feedthrough to which the detector is mounted, wherein the detector is electrically connected through the feedthrough; an electrical shield configured to shield at least part of the detector module from electrical fields, wherein the electrical shield is mounted to the support such that during operation, with applied disturbances that deform the support, the part of the detector module that is shielded by the electrical shield is maintained.

According to some aspects of the present disclosure, there is provided a method of detecting an incidental charged particle beam in a charged particle beam inspection tool, the method comprising: a) providing a detector module, the detector module comprising: a detector configured to be alignable with an incidental charged particle beam path; and a support for defining at least a part of the wall of the vacuum chamber, the support comprising a feedthrough to which the detector is mounted, wherein the detector is electrically connected through the feedthrough, wherein applied disturbances deform the support; wherein the detector module is configured so that, with disturbances to the detector and/or support, the position of the detector during operation of the detector is maintained relative to the incidental charged particle beam path; b) providing a vacuum environment around the detector; c) providing an incidental charged particle beam for detection by the detector.

According to some aspects of the present disclosure, there is provided a method of detecting an incidental charged particle beam in a charged particle beam inspection tool, the method comprising: a) providing a detector module comprising: a detector configured to operate in a vacuum chamber, the detector being configured to be alignable with an incidental charged particle beam path; a support for defining at least a part of the wall of the vacuum chamber, the support comprising a feedthrough to which the detector is mounted, wherein the detector is electrically connected through the feedthrough; a thermal conditioning system comprising a support thermal conditioning section configured to thermally condition the support and a further thermal conditioning section configured to thermally condition another part of the detector module; and a separable portion comprising the other part and the further thermal conditioning section, wherein the separable portion is configured to be removable from the detector module b) providing fluid to the support thermal conditioning section and the further thermal conditioning section; c) providing the vacuum environment around the detector; and d) providing an incidental charged particle beam for detection by the detector.

According to some aspects of the present disclosure, there is provided a method of detecting an incidental charged particle beam in a charged particle beam inspection tool, the method comprising: a) providing a detector module comprising: a detector configured to operate in a vacuum chamber, the detector being configured to be alignable with an incidental charged particle beam path; a support for defining at least a part of the wall of the vacuum chamber, the support comprising a feedthrough to which the detector is mounted, wherein the detector is electrically connected through the feedthrough; an electrical shield configured to shield at least part of the detector module from electrical fields, wherein the electrical shield is mounted to the support such that during operation, with applied disturbances that deform the support, the part of the detector module that is shielded by the shield is maintained; b) providing the vacuum environment around the detector; c) providing an incidental charged particle beam for detection by the detector.

According to some aspects of the present disclosure, there is provided a method of detecting an incidental charged particle beam using a detector module of the appended claims.

Furthermore, embodiments of the present disclosure provide apparatuses, systems, and methods for sealing a vacuum system configured to provide an atmospheric environment and a vacuum chamber environment. In some embodiments, a printed circuit board (PCB) may include a first side for exposing to the atmospheric environment, and a second side for exposing to the vacuum chamber environment and for covering an aperture in the vacuum chamber environment, wherein the second side is opposite to the first side. The system may include a rigid body on the first side of the PCB and a device connected to the second side of the PCB and positioned on a portion of the PCB that covers the aperture. The PCB may be configured to provide an interface between the device and the rigid body.

In some embodiments, a method for sealing a vacuum system configured to provide an atmospheric environment and a vacuum chamber environment may include providing an interface between a device and a rigid body using a PCB. The PCB may include a first side for exposing to the atmospheric environment, and a second side for exposing to the vacuum chamber environment and for covering an aperture in the vacuum chamber environment, wherein the second side is opposite to the first side. The rigid body may be on the first side of the PCB and the device may be connected to the second side of the PCB and positioned on a portion of the PCB that covers the aperture. The method may include operating the device in the vacuum system.

BRIEF DESCRIPTION OF THE DRAWINGS

The above and other aspects of the present disclosure will become more apparent from the description of the embodiments, taken in conjunction with the accompanying drawings.

FIG. 4A is a schematic diagram illustrating a detector module consistent with embodiments of the present disclosure.

FIG. 7 is a schematic diagram illustrating a detector module consistent with embodiments of the present disclosure.

Figure 1:
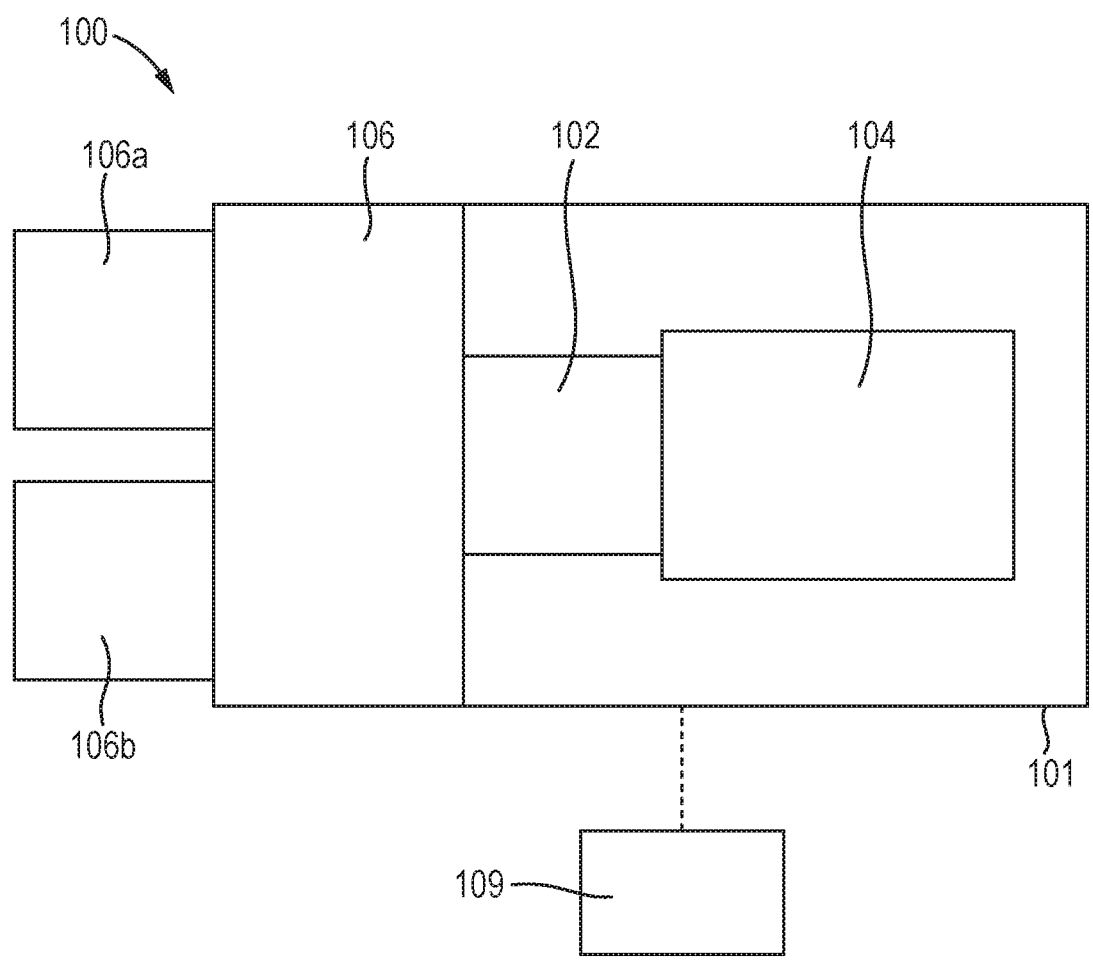
FIG. 1 is a schematic diagram illustrating an exemplary electron beam inspection (EBI) system, consistent with embodiments of the present disclosure.

The schematic diagrams and views show the components described below. However, the components depicted in the figures may not be to scale.

DETAILED DESCRIPTION

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the disclosure. Instead, they are merely examples of apparatuses and methods consistent with aspects related to the subject matter recited in the appended claims. For example, although some embodiments are described in the context of utilizing electron beams, the disclosure is not so limited. Other types of charged particle beams may be similarly applied. The terms charged particle and electron are used interchangeably herein. Furthermore, other imaging systems may be used, such as optical imaging, photodetection, x-ray detection, extreme ultraviolet inspection, deep ultraviolet inspection, or the like.

Electronic devices are constructed of circuits formed on a piece of silicon called a substrate. Many circuits may be formed together on the same piece of silicon and are called integrated circuits or ICs. The size of these circuits has decreased dramatically so that many more of them can fit on the substrate. For example, an IC chip in a smart phone can be as small as a thumbnail and yet may include over 2 billion transistors, the size of each transistor being less than 1/1000th the size of a human hair.

Making these extremely small ICs is a complex, time-consuming, and expensive process, often involving hundreds of individual steps. Errors in even one step have the potential to result in defects in the finished IC rendering it useless. Thus, one goal of the manufacturing process is to avoid such defects to maximize the number of functional ICs made in the process, that is, to improve the overall yield of the process.

One component of improving yield is monitoring the chip making process to ensure that it is producing a sufficient number of functional integrated circuits. One way to monitor the process is to inspect the chip circuit structures at various stages of their formation. Inspection may be carried out using a scanning electron microscope (SEM). A SEM can be used to image these extremely small structures, in effect, taking a "picture" of the structures of the wafer. The image can be used to determine if the structure was formed properly and also if it was formed at the proper location. If the structure is defective, then the process can be adjusted so the defect is less likely to recur.

The working principle of a SEM is similar to a camera. A camera takes a picture by receiving and recording brightness and colors of light reflected or emitted from people or objects. A SEM takes a "picture" by receiving and recording energies or quantities of electrons reflected or emitted from the structures. Before taking such a "picture," an electron beam may be provided onto the structures, and when the electrons are reflected or emitted ("exiting") from the structures, a detector of the SEM may receive and record the energies or quantities of those electrons to generate an image. To take such a "picture," some SEMs use a single electron beam (referred to as a "single-beam SEM"), while some SEMs use multiple electron beams (referred to as a "multi-beam SEM") to take multiple "pictures" of the wafer. By using multiple electron beams, the SEM may provide more electron beams onto the structures for obtaining these multiple "pictures," resulting in more electrons exiting from the structures. Accordingly, the detector may receive more exiting electrons simultaneously, and generate images of the structures of the wafer with a higher efficiency and a faster speed.

A SEM may operate in a vacuum chamber environment. For example, during high-temperature processes (e.g., a bake-out), a SEM may operate under a high temperature and vacuum chamber environment to remove fluids or gases from the vacuum chamber environment. When the SEM prepares for or operates in the vacuum environment, however, water vapor or air molecules may leak into the vacuum chamber from other system components, the result of which may not be desirable for a number of reasons. One reason is that the leakage may cause the vacuum chamber to take longer to get to a predetermined pressure before inspection of a wafer may occur, thereby slowing throughput, or even preventing the vacuum chamber from being able to reach the predetermined pressure. For example, water vapor or air molecules may leak from an atmospheric environment due to inadequate sealing between the atmospheric environment and the vacuum environment. When water vapor or air molecules leak into the vacuum chamber, the pressure of vacuum chamber may increase, thereby preventing the vacuum chamber from reaching the predetermined pressure needed for inspection. This prolonged time (e.g., pump down time) for the system to reach the predetermined pressure may reduce system availability.

Additionally, water vapor and air molecules may reduce the life of the inspection system due to components sensitive to such contaminants in the system (e.g., pure aluminum components, high voltage components, charged particle source component, etc.). Thus, the ability to prevent water vapor and air molecules from entering the vacuum chamber is crucial to increasing the throughput and life of the inspection system. The type of seal between the atmospheric environment and the vacuum environment may be crucial to preventing fluids and gases from entering the vacuum environment.

In addition to undergoing high-temperature processes, inspection involves the use of opto-electric components such as position sensors, mirrors, motors, detectors, etc. that may dissipate high amounts of heat during inspection. Exposing opto-electric components to excessive heat for extended periods of time may cause premature failure of the opto-electric components. Such failure of the opto-electric components may cause fatal errors when manufacturing the computer chip or locating a defect on the wafer. Even slight changes in temperature may reduce the collection efficiency of signal charged particles, e.g. signal electrons, such as secondary (SE) and backscattered electrons (BSE), thus adversely affecting the throughput and inspection yield. The use of separate cooling feedthroughs may not be desirable since they may occupy large areas of the inspection system and require adjustments to the inspection system for each high-temperature process, thereby causing stage positioning error and beam placement accuracy error.

Applied disturbances can affect the position of a detector relative to the signal charged particles. For example, thermal load applied due to electronic components, the detector (and particularly a detection portion of the detector) and/or incidental electrons can cause components supporting the detector to distort. Such a thermal load may occur during operation of the detector. In some embodiments, thermal load may occur if a fault occurs. Additionally, components may be exposed to very high temperature during operation, such as during bake out. Distortion of any components supporting the detector can result in a change of position of a detection portion relative to the signal charged particles. This can lead to consequential misalignment of the detector and the errors described above.

At least some operations may rely on very high heat load (e.g., bake out). Some components, such as the detecting portion may be capable of being exposed to extreme heat load. However, it may be preferable to avoid exposing other components, such as electronics, to such high heat loads.

Devices which may be used for inspection (e.g., a detector module comprising at least a detector) may only have a limited space in which it can be provided. Thus, there may be a limit on the volume available for the detector module to limit the total footprint of the detector and any components included in the detector module. Therefore, the detector module is may be provided in a compact configuration.

This disclosure describes, among others, a detector module and associated methods for detection of incidental charged particles beams.

This disclosure describes, among others, methods and systems for sealing a vacuum system configured to provide an atmospheric environment and a vacuum chamber environment using a printed circuit board (PCB). In some embodiments, the PCB may form an interface between a vacuum chamber environment and an atmospheric environment. A device may be connected to the PCB and exposed to the vacuum chamber environment. In some embodiments, a cooling system may be connected to the PCB and exposed to the atmospheric environment. The cooling system may provide mechanical support to the PCB and reinforce a hermetic seal provided by the PCB, and may provide cooling for the device. In some embodiments, the device may be provided in an aperture of a ring inside the vacuum chamber environment. A sealing layer may be provided between the ring and the PCB such that the sealing layer is provided on a single side of the PCB. The inspection system may adapt to multiple applications that optimize throughput of the inspection system.

Relative dimensions of components in drawings may be exaggerated for clarity. Within the following description of drawings, the same or like reference numbers refer to the same or like components or entities, and only the differences with respect to the individual embodiments are described.

As used herein, unless specifically stated otherwise, the term "or" encompasses all possible combinations, except where infeasible. For example, if it is stated that a component may include A or B, then, unless specifically stated otherwise or infeasible, the component may include A, or B, or A and B. As a second example, if it is stated that a component may include A, B, or C, then, unless specifically stated otherwise or infeasible, the component may include A, or B, or C, or A and B, or A and C, or B and C, or A and B and C.

FIG. 1 illustrates an exemplary electron beam inspection (EBI) system 100 consistent with embodiments of the present disclosure. EBI system 100 may be used for imaging. As shown in FIG. 1, EBI system 100 includes a main chamber 101, a load/lock chamber 102, an electron beam tool 104, and an equipment front end module (EFEM) 106. Electron beam tool 104 is located within main chamber 101. EFEM 106 includes a first loading port 106a and a second loading port 106b. EFEM 106 may include additional loading port(s). First loading port 106a and second loading port 106b receive wafer front opening unified pods (FOUPs) that contain wafers (e.g., semiconductor wafers or wafers made of other material(s)) or samples to be inspected (wafers and samples may be used interchangeably). A "lot" is a plurality of wafers that may be loaded for processing as a batch.

One or more robotic arms (not shown) in EFEM 106 may transport the wafers to load/lock chamber 102. Load/lock chamber 102 is connected to a load/lock vacuum pump system (not shown) which removes gas molecules in load/lock chamber 102 to reach a first pressure below the atmospheric pressure. After reaching the first pressure, one or more robotic arms (not shown) may transport the wafer from load/lock chamber 102 to main chamber 101. Main chamber 101 is connected to a main chamber vacuum pump system (not shown) which removes gas molecules in main chamber 101 to reach a second pressure below the first pressure. After reaching the second pressure, the wafer is subject to inspection by electron beam tool 104. Electron beam tool 104 may be a single-beam system or a multi-beam system.

A controller 109 is electronically connected to electron beam tool 104. Controller 109 may be a computer configured to execute various controls of EBI system 100. While controller 109 is shown in FIG. 1 as being outside of the structure that includes main chamber 101, load/lock chamber 102, and EFEM 106, it is appreciated that controller 109 may be a part of the structure.

In some embodiments, controller 109 may include one or more processors (not shown). A processor may be a generic or specific electronic device capable of manipulating or processing information. For example, the processor may include any combination of any number of a central processing unit (or "CPU"), a graphics processing unit (or "GPU"), an optical processor, a programmable logic controllers, a microcontroller, a microprocessor, a digital signal processor, an intellectual property (IP) core, a Programmable Logic Array (PLA), a Programmable Array Logic (PAL), a Generic Array Logic (GAL), a Complex Programmable Logic Device (CPLD), a Field-Programmable Gate Array (FPGA), a System On Chip (SoC), an Application-Specific Integrated Circuit (ASIC), and any type circuit capable of data processing. The processor may also be a virtual processor that includes one or more processors distributed across multiple machines or devices coupled via a network.

In some embodiments, controller 109 may further include one or more memories (not shown). A memory may be a generic or specific electronic device capable of storing codes and data accessible by the processor (e.g., via a bus). For example, the memory may include any combination of any number of a random-access memory (RAM), a read-only memory (ROM), an optical disc, a magnetic disk, a hard drive, a solid-state drive, a flash drive, a security digital (SD) card, a memory stick, a compact flash (CF) card, or any type of storage device. The codes may include an operating system (OS) and one or more application programs (or "apps") for specific tasks. The memory may also be a virtual memory that includes one or more memories distributed across multiple machines or devices coupled via a network.

Figure 2:
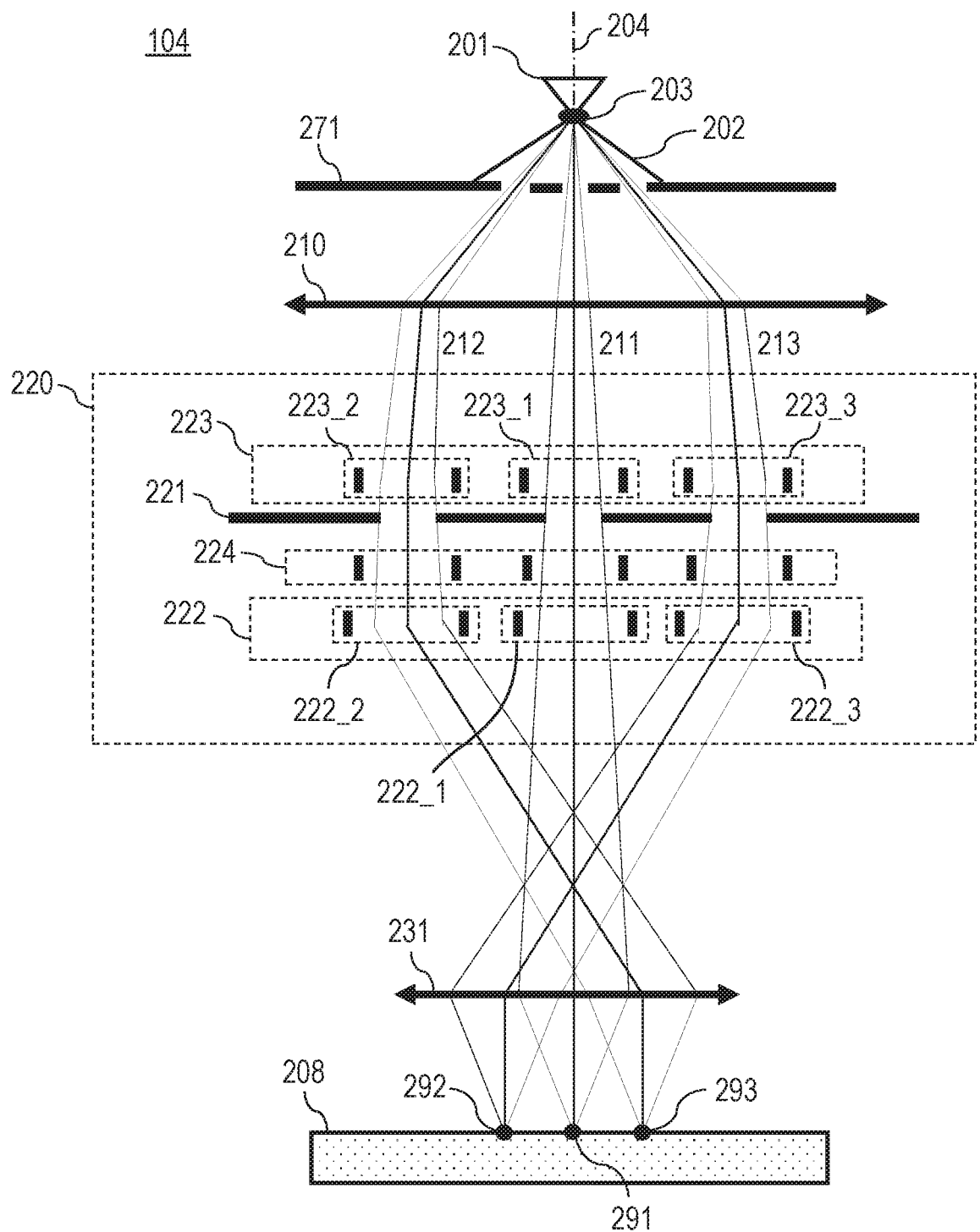
FIG. 2 is a schematic diagram illustrating an exemplary multi-beam electron-optical column that may be part of the exemplary electron beam inspection system of FIG. 1.

Reference is now made to FIG. 2, which is a schematic diagram of an exemplary electron beam tool 104 of the EBI system 100 of FIG. 1. The electron beam tool 104 is described here as a multi-beam electron-optical column 104, although as described above, the tool could be used as a single-beam electron-optical column. Additionally, the EBI system is referred to as the inspection apparatus 100 of FIG. 1. In some embodiments, the inspection apparatus 100 is a single-beam inspection apparatus. The electron-optical column 104 may comprise an electron source 201, a beam former array 271 (also known as a Coulomb aperture plate, a "gun aperture plate", a coulomb aperture array or a pre-sub-beam-forming aperture array), a condenser lens 210, a source converter (also known as a source conversion unit or micro-optical array) 220, an objective lens 231, and a target 208 (which may be a sample). In some embodiments, the condenser lens 210 is magnetic. The target 208 may be supported by a support on a stage. The stage may be motorized. The stage moves so that the target 208 is scanned by the incidental electrons. The electron source 201, the beam former array 271, the condenser lens 210 may be the components of an illumination apparatus comprised by the electron-optical column 104. The source converter 220 (also known as a source conversion unit), described in more detail below, and the objective lens 231 may be the components of a projection apparatus comprised by the electron-optical column 104.

The electron source 201, the beam former array 271, the condenser lens 210, the source converter 220, and the objective lens 231 are aligned with a primary electron-optical axis 204 (also known as the primary optical axis) of the electron-optical column 104. The electron source 201 may generate a primary beam 202 (also known as a primary electron beam) generally along the electron-optical axis 204 and with a source crossover (virtual or real) 203 (also known as a primary beam crossover). During operation, the electron source 201 is configured to emit electrons. The electrons are extracted or accelerated by an extractor and/or an anode to form the primary beam 202.

The beam former array 271 cuts the peripheral electrons of primary electron beam 202 to reduce a consequential Coulomb effect. The primary-electron beam 202 may be trimmed into a specified number of sub-beams, such as three sub-beams 211, 212 and 213, by the beam former array 271. It should be understood that the description is intended to apply to an electron-optical column 104 with any number of sub-beams such as one, two or more than three. The beam former array 271, in operation, is configured to block off peripheral electrons to reduce the Coulomb effect. The Coulomb effect may enlarge the size of each of the probe spots 291, 292, 293 and therefore deteriorate inspection resolution. The beam former array 271 reduces aberrations resulting from Coulomb interactions between electrons projected in the beam. The beam former array 271 may include multiple openings for generating primary sub-beams even before the source converter 220.

The source converter 220 is configured to convert the beam (including sub-beams if present) transmitted by the beam former array 271 into the sub-beams that are projected towards the target 208. The term source converter/source converter unit may be used interchangeably and may be used simply as a collective term for the group of components that form the beamlets from the sub-beams.

As shown in FIG. 2, in some embodiments, the electron-optical column 104 comprises a beam-limiting aperture array 221 with an aperture pattern (e.g., apertures arranged in a formation) configured to define the outer dimensions of the beamlets, or sub-beams, projected towards the target 208. In some embodiments, the beam-limiting aperture array 221 is part of the source converter 220. In some embodiments, the beam-limiting aperture array 221 is part of the system up-beam of the main column. In some embodiments, the beam-limiting aperture array 221 divides one or more of the sub-beams 211, 212, 213 into beamlets such that the number of beamlets projected towards the target 208 is greater than the number of sub-beams transmitted through the beam former array 271. In some embodiments, the beam-limiting aperture array 221 keeps the number of the sub-beams incident on the beam-limiting aperture array 221, in which case the number of sub-beams may equal the number of beamlets projected towards the target 208.

As shown in FIG. 2, in some embodiments the electron-optical column 104 comprises a pre-bending deflector array 223 with pre-bending deflectors 223_1, 2232, and 223_3 to bend the sub-beams 211, 212, and 213 respectively. The pre-bending deflectors 223_1, 2232, and 223_3 may bend the path of the sub-beams 211, 212, and 213 onto the beam-limiting aperture array 221.

The electron-optical column 104 may also include an image-forming element array 222 with image-forming deflectors 222_1, 2222, and 222_3. There is a respective deflector 222_1, 2222, and 222_3 associated with the path of each beamlet. The deflectors 222_1, 2222, and 222_3 are configured to deflect the paths of the beamlets towards the electron-optical axis 204. The deflected beamlets form virtual images (not shown) of source crossover 203. In some embodiments, these virtual images are projected onto the target 208 by the objective lens 231 and form probe spots 291, 292, 293 thereon. The electron-optical column 104 may also include an aberration compensator array 224 configured to compensate aberrations that may be present in each of the sub-beams. In some embodiments, the aberration compensator array 224 comprises a lens configured to operate on a respective beamlet. The lens may take the form or an array of lenses. The lenses in the array may operate on a different beamlet of the multi-beam. The aberration compensator array 224 may, for example, include a field curvature compensator array (not shown) for example with micro-lenses.

The field curvature compensator and micro-lenses may, for example, be configured to compensate the individual sub-beams for field curvature aberrations evident in the probe spots, 291, 292, and 293. The aberration compensator array 224 may include an astigmatism compensator array (not shown) with micro-stigmators. The micro-stigmators may, for example, be controlled to operate on the sub-beams to compensate astigmatism aberrations that are otherwise present in the probe spots, 291, 292, and 293.

The source converter 220 may further comprise a pre-bending deflector array 223 with pre-bending deflectors 223_1, 223_2, and 223_3 to bend the sub-beams 211, 212, and 213 respectively. The pre-bending deflectors 223_1, 2232, and 223_3 may bend the path of the sub-beams onto the beam-limiting aperture array 221. In some embodiments, the pre-bending micro-deflector array 223 may be configured to bend the sub-beam path of sub-beams towards the orthogonal of the plane of on beam-limiting aperture array 221. In some embodiments the condenser lens 210 may adjust the path direction of the sub-beams onto the beam-limiting aperture array 221. The condenser lens 210 may, for example, focus (collimate) the three sub-beams 211, 212, and 213 to become substantially parallel beams along primary electron-optical axis 204, so that the three sub-beams 211, 212, and 213 incident substantially perpendicularly onto source converter 220, which may correspond to the beam-limiting aperture array 221. In some embodiments the pre-bending deflector array 223 may not be necessary.

The image-forming element array 222, the aberration compensator array 224, and the pre-bending deflector array 223 may comprise multiple layers of sub-beam manipulating devices, some of which may be in the form or arrays, for example: micro-deflectors, micro-lenses, or micro-stigmators. Beam paths may be manipulated rotationally. Rotational corrections may be applied by a magnetic lens. Rotational corrections may be achieved by an existing magnetic lens such as the condenser lens arrangement.

In some embodiments of the electron-optical column 104, the beamlets are respectively deflected by the deflectors 222_1, 2222, and 222_3 of the image-forming element array 222 towards the electron-optical axis 204. It should be understood that the beamlet path may already correspond to the electron-optical axis 204 prior to reaching deflector 222_1, 2222, and 222_3.

The objective lens 231 focuses the beamlets onto the surface of the target 208, i.e., it projects the three virtual images onto the target surface. The three images formed by three sub-beams 211 to 213 on the target surface form three probe spots 291, 292 and 293 thereon. In some embodiments the deflection angles of sub-beams 211 to 213 are adjusted to pass through or approach the front focal point of objective lens 231 to reduce or limit the off-axis aberrations of three probe spots 291 to 293. In some embodiments the objective lens 231 is magnetic. Although three beamlets are mentioned, this is by way of example only. There may be any number of beamlets.

A manipulator is configured to manipulate one or more beams of charged particles. The term manipulator encompasses a deflector, a lens and an aperture. The pre-bending deflector array 223, the aberration compensator array 224 and the image-forming element array 222 may individually or in combination with each other, be referred to as a manipulator array, because they manipulate one or more sub-beams or beamlets of charged particles. The lens and the deflectors 222_1, 2222, and 222_3 may be referred to as manipulators because they manipulate one or more sub-beams or beamlets of charged particles.

Figure 3:
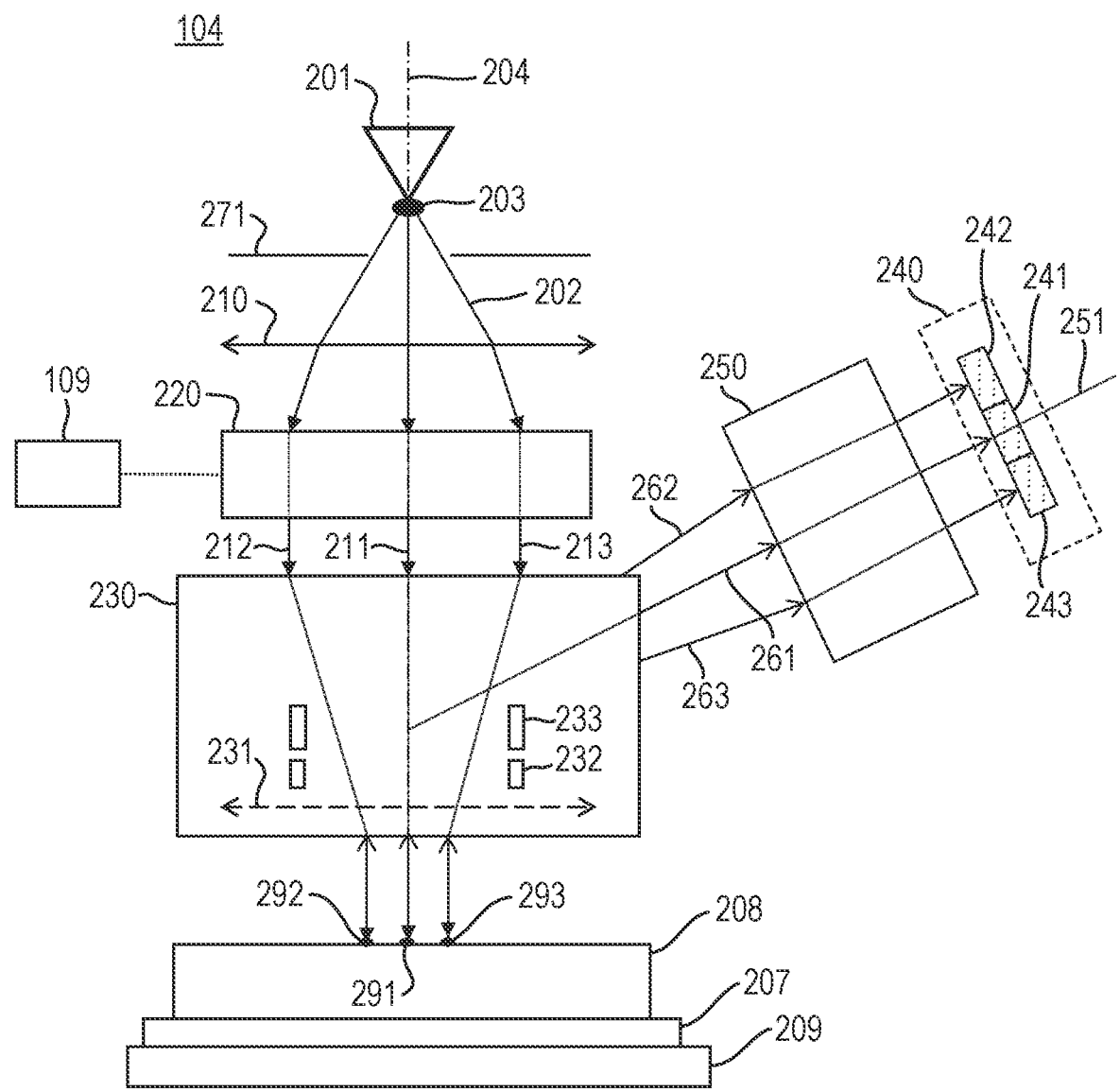
FIG. 3 is a schematic diagram illustrating an exemplary multi-beam system that is part of the exemplary charged particle beam inspection system of FIG. 1, consistent with embodiments of the present disclosure.

In some embodiments a beam separator may be provided. Although not shown in FIG. 2, FIG. 3 depicts the beam separator 233. The beam separator may be down-beam of the source converter 220. The beam separator may be, for example, a Wien filter comprising an electrostatic dipole field and a magnetic dipole field. The beam separator may be positioned between adjacent sections of shielding in the direction of the beam path. The inner surface of the shielding may be radially inward of the beam separator. In some embodiments, the beam separator may be within the shielding. In operation, the beam separator may be configured to exert an electrostatic force by electrostatic dipole field on individual electrons of sub-beams. In some embodiments, the electrostatic force is equal in magnitude but opposite in direction to the magnetic force exerted by the magnetic dipole field of beam separator on the individual primary electrons of the sub-beams. The sub-beams may therefore pass at least substantially straight through the beam separator with at least substantially zero deflection angles. The direction of the magnetic force depends on the direction of motion of the electrons while the direction of the electrostatic force does not depend on the direction of motion of the electrons. So because the secondary electrons and backscattered electrons generally move in an opposite direction compared to the primary electrons, the magnetic force exerted on the secondary electrons and backscattered electrons will no longer cancel the electrostatic force and as a result the secondary electrons and backscattered electrons moving through the beam separator will be deflected away from the electron-optical axis 204.

In some embodiments a secondary column is provided comprising detection elements for detecting corresponding secondary charged particle beams. The secondary column is not shown in FIG. 2. The secondary column is described in further detail in relation to FIG. 3. On incidence of secondary beams with the detection elements, the elements may generate corresponding intensity signal outputs. The outputs may be directed to an image processing system (e.g., controller 109). Each detection element may comprise one or more pixels. The intensity signal output of a detection element may be a sum of signals generated by all the pixels within the detection element.

In some embodiments a secondary projection apparatus and its associated electron detection device (not shown) are provided. The secondary projection apparatus and its associated electron detection device may be aligned with a secondary electron-optical axis of the secondary column. In some embodiments the beam separator is arranged to deflect the path of the secondary electron beams towards the secondary projection apparatus. The secondary projection apparatus subsequently focuses the path of secondary electron beams onto a plurality of detection regions of the electron detection device. The secondary projection apparatus and its associated electron detection device may register and generate an image of the target 208 using the secondary electrons or backscattered electrons.

In some embodiments the inspection apparatus 100 comprises a single source.

Any element or collection of elements may be replaceable or field replaceable within the electron-optical column. The one or more electron-optical components in the column, especially those that operate on sub-beams or generate sub-beams, such as aperture arrays and manipulator arrays may comprise one or more microelectromechanical systems (MEMS). The pre-bending deflector array 223 may be a MEMS. MEMS are miniaturized mechanical and electromechanical elements that are made using microfabrication techniques. In some embodiments the electron-optical column 104 comprises apertures, lenses and deflectors formed as MEMS. In some embodiments, the manipulators such as the lenses and deflectors 222_1, 222_2, and 222_3 are controllable, passively, actively, as a whole array, individually or in groups within an array, so as to control the beamlets of charged particles projected towards the target 208.

In some embodiments the electron-optical column 104 may comprise alternative and/or additional components on the charged particle path, such as lenses and other components some of which have been described earlier with reference to FIG. 1 and/or later with reference to FIG. 3. In particular, embodiments include an electron-optical column 104 that divides a charged particle beam from a source into a plurality of sub-beams. A plurality of respective objective lenses may project the sub-beams onto a sample. In some embodiments, a plurality of condenser lenses is provided up-beam from the objective lenses. The condenser lenses focus each of the sub-beams to an intermediate focus up-beam of the objective lenses. In some embodiments, collimators are provided up-beam from the objective lenses. Correctors may be provided to reduce focus error and/or aberrations. In some embodiments, such correctors are integrated into or positioned directly adjacent to the objective lenses. Where condenser lenses are provided, such correctors may be integrated into, or positioned directly adjacent to, the condenser lenses and/or positioned in, or directly adjacent to, the intermediate foci. A detector is provided to detect charged particles emitted by the sample. The detector may be integrated into the objective lens. The detector may be on the bottom surface of the objective lens so as to face a sample in use. The condenser lenses, objective lenses and/or detector may be formed as MEMS or CMOS devices.

Reference is now made to FIG. 3, which is a schematic diagram illustrating an exemplary electron beam tool 104 including a multi-beam inspection tool that is part of the EBI system 100 of FIG. 1, consistent with embodiments of the present disclosure. The tool 104 of FIG. 3 may function, or comprise features, as described in relation to the tool 104 of FIG. 2. In some embodiments, electron beam tool 104 may be operated as a single-beam inspection tool that is part of EBI system 100 of FIG. 1. Multi-beam electron beam tool 104 (also referred to herein as apparatus 104) comprises an electron source 201, a Coulomb aperture plate (or "gun aperture plate") 271, a condenser lens 210, a source conversion unit 220, a primary projection system 230, a motorized stage 209, and a sample holder 207 supported by motorized stage 209 to hold a sample 208 (e.g., a wafer or a photomask) to be inspected. Multi-beam electron beam tool 104 may further comprise a secondary projection system 250 and an electron detection device 240. Primary projection system 230 may comprise an objective lens 231. Electron detection device 240 may comprise a plurality of detection elements 241, 242, and 243. A beam separator 233 and a deflection scanning unit 232 may be positioned inside primary projection system 230.

Electron source 201, Coulomb aperture plate 271, condenser lens 210, source conversion unit 220, beam separator 233, deflection scanning unit 232, and primary projection system 230 may be aligned with a primary optical axis 204 of apparatus 104. Secondary projection system 250 and electron detection device 240 may be aligned with a secondary optical axis 251 of apparatus 104.

Electron source 201 may comprise a cathode (not shown) and an extractor or anode (not shown), in which, during operation, electron source 201 is configured to emit primary electrons from the cathode and the primary electrons are extracted or accelerated by the extractor and/or the anode to form a primary electron beam 202 that form a primary beam crossover (virtual or real) 203. Primary electron beam 202 may be visualized as being emitted from primary beam crossover 203.

The source conversion unit 220 may function, or comprise features, as described in relation to FIG. 2. Source conversion unit 220 may comprise an image-forming element array (not shown), an aberration compensator array (not shown), a beam-limit aperture array (not shown), and a pre-bending micro-deflector array (not shown). In some embodiments, the pre-bending micro-deflector array deflects a plurality of primary beamlets 211, 212, 213 of primary electron beam 202 to normally enter the beam-limit aperture array, the image-forming element array, and an aberration compensator array. In some embodiments, apparatus 104 may be operated as a single-beam system such that a single primary beamlet is generated. In some embodiments, condenser lens 210 is designed to focus primary electron beam 202 to become a parallel beam and be normally incident onto source conversion unit 220. The image-forming element array may comprise a plurality of micro-deflectors or micro-lenses to influence the plurality of primary beamlets 211, 212, 213 of primary electron beam 202 and to form a plurality of parallel images (virtual or real) of primary beam crossover 203, one for each of the primary beamlets 211, 212, and 213. In some embodiments, the aberration compensator array may comprise a field curvature compensator array (not shown) and an astigmatism compensator array (not shown). The field curvature compensator array may comprise a plurality of micro-lenses to compensate field curvature aberrations of the primary beamlets 211, 212, and 213. The astigmatism compensator array may comprise a plurality of micro-stigmators to compensate astigmatism aberrations of the primary beamlets 211, 212, and 213. The beam-limit aperture array may be configured to limit diameters of individual primary beamlets 211, 212, and 213. FIG. 2 shows three primary beamlets 211, 212, and 213 as an example, and it is appreciated that source conversion unit 220 may be configured to form any number of primary beamlets. Controller 109 may be connected to various parts of EBI system 100 of FIG. 1, such as source conversion unit 220, electron detection device 240, primary projection system 230, or motorized stage 209. In some embodiments, as explained in further details below, controller 109 may perform various image and signal processing functions. Controller 109 may also generate various control signals to govern operations of the charged particle beam inspection system.

Condenser lens 210 is configured to focus primary electron beam 202. Condenser lens 210 may further be configured to adjust electric currents of primary beamlets 211, 212, and 213 downstream of source conversion unit 220 by varying the focusing power of condenser lens 210. In some embodiments, the electric currents may be changed by altering the radial sizes of beam-limit apertures within the beam-limit aperture array corresponding to the individual primary beamlets. The electric currents may be changed by both altering the radial sizes of beam-limit apertures and the focusing power of condenser lens 210. Condenser lens 210 may be an adjustable condenser lens that may be configured so that the position of its first principle plane is movable. The adjustable condenser lens may be configured to be magnetic, which may result in off-axis beamlets 212 and 213 illuminating source conversion unit 220 with rotation angles. The rotation angles change with the focusing power or the position of the first principal plane of the adjustable condenser lens. Condenser lens 210 may be an anti-rotation condenser lens that may be configured to keep the rotation angles unchanged while the focusing power of condenser lens 210 is changed. In some embodiments, condenser lens 210 may be an adjustable anti-rotation condenser lens, in which the rotation angles do not change when its focusing power and the position of its first principal plane are varied.

Objective lens 231 may be configured to focus beamlets 211, 212, and 213 onto a sample 208 for inspection and may form, in the current embodiments, three probe spots 291, 292, and 293 on the surface of sample 208. Coulomb aperture plate 271, in operation, is configured to block off peripheral electrons of primary electron beam 202 to reduce Coulomb effect. The Coulomb effect may enlarge the size of each of probe spots 291, 292, and 293 of primary beamlets 211, 212, 213, and therefore deteriorate inspection resolution.

Beam separator 233 may, for example, be a Wien filter comprising an electrostatic deflector generating an electrostatic dipole field and a magnetic dipole field (not shown in FIG. 3). In operation, beam separator 233 may be configured to exert an electrostatic force by electrostatic dipole field on individual electrons of primary beamlets 211, 212, and 213. The electrostatic force is equal in magnitude but opposite in direction to the magnetic force exerted by magnetic dipole field of beam separator 233 on the individual electrons. Primary beamlets 211, 212, and 213 may therefore pass at least substantially straight through beam separator 233 with at least substantially zero deflection angles.

Deflection scanning unit 232, in operation, is configured to deflect primary beamlets 211, 212, and 213 to scan probe spots 291, 292, and 293 across individual scanning areas in a section of the surface of sample 208. In response to incidence of primary beamlets 211, 212, and 213 or probe spots 291, 292, and 293 on sample 208, electrons emerge from sample 208 and generate three secondary electron beams 261, 262, and 263. Each of secondary electron beams 261, 262, and 263 typically comprise secondary electrons (having electron energy ≤50 eV) and backscattered electrons (having electron energy between 50 eV and the landing energy of primary beamlets 211, 212, and 213). Beam separator 233 is configured to deflect secondary electron beams 261, 262, and 263 towards secondary projection system 250. Secondary projection system 250 subsequently focuses secondary electron beams 261, 262, and 263 onto detection elements 241, 242, and 243 of electron detection device 240. Detection elements 241, 242, and 243 are arranged to detect corresponding secondary electron beams 261, 262, and 263 and generate corresponding signals which are sent to controller 109 or a signal processing system (not shown), for example, to construct images of the corresponding scanned areas of sample 208.

In some embodiments, detection elements 241, 242, and 243 detect corresponding secondary electron beams 261, 262, and 263, respectively, and generate corresponding intensity signal outputs (not shown) to an image processing system (e.g., controller 109). In some embodiments, each detection element 241, 242, and 243 may comprise one or more pixels. The intensity signal output of a detection element may be a sum of signals generated by all the pixels within the detection element.

In some embodiments, controller 109 may comprise image processing system that includes an image acquirer (not shown), a storage (not shown). The image acquirer may comprise one or more processors. For example, the image acquirer may comprise a computer, server, mainframe host, terminals, personal computer, any kind of mobile computing devices, and the like, or a combination thereof. The image acquirer may be communicatively coupled to electron detection device 240 of apparatus 104 through a medium such as an electrical conductor, optical fiber cable, portable storage media, IR, Bluetooth, internet, wireless network, wireless radio, among others, or a combination thereof. In some embodiments, the image acquirer may receive a signal from electron detection device 240 and may construct an image. The image acquirer may thus acquire images of sample 208. The image acquirer may also perform various post-processing functions, such as generating contours, superimposing indicators on an acquired image, and the like. The image acquirer may be configured to perform adjustments of brightness and contrast, etc. of acquired images. In some embodiments, the storage may be a storage medium such as a hard disk, flash drive, cloud storage, random access memory (RAM), other types of computer readable memory, and the like. The storage may be coupled with the image acquirer and may be used for saving scanned raw image data as original images, and post-processed images.

In some embodiments, the image acquirer may acquire one or more images of a sample based on an imaging signal received from electron detection device 240. An imaging signal may correspond to a scanning operation for conducting charged particle imaging. An acquired image may be a single image comprising a plurality of imaging areas. The single image may be stored in the storage. The single image may be an original image that may be divided into a plurality of regions. Each of the regions may comprise one imaging area containing a feature of sample 208. The acquired images may comprise multiple images of a single imaging area of sample 208 sampled multiple times over a time sequence. The multiple images may be stored in the storage. In some embodiments, controller 109 may be configured to perform image processing steps with the multiple images of the same location of sample 208.

In some embodiments, controller 109 may include measurement circuitries (e.g., analog-to-digital converters) to obtain a distribution of the detected secondary electrons. The electron distribution data collected during a detection time window, in combination with corresponding scan path data of each of primary beamlets 211, 212, and 213 incident on the wafer surface, can be used to reconstruct images of the wafer structures under inspection. The reconstructed images can be used to reveal various features of the internal or external structures of sample 208, and thereby can be used to reveal any defects that may exist in the wafer.

In some embodiments, controller 109 may control motorized stage 209 to move sample 208 during inspection of sample 208. In some embodiments, controller 109 may enable motorized stage 209 to move sample 208 in a direction continuously at a constant speed. In other embodiments, controller 109 may enable motorized stage 209 to change the speed of the movement of sample 208 overtime depending on the steps of scanning process.

Although FIG. 3 shows that apparatus 104 uses three primary electron beams, it is appreciated that apparatus 104 may use two or more number of primary electron beams. In some embodiments, the apparatus 104 might only use a single beam. The present disclosure does not limit the number of primary electron beams used in apparatus 104. In some embodiments, apparatus 104 may be a SEM used for lithography.

Compared with a single charged-particle beam imaging system ("single-beam system"), a multiple charged-particle beam imaging system ("multi-beam system") may be designed to optimize throughput for different scan modes. Embodiments of this disclosure provide a multi-beam system with the capability of optimizing throughput for different scan modes by using beam arrays with different geometries. adapting to different throughputs and resolution requirements.

A non-transitory computer readable medium may be provided that stores instructions for a processor (e.g., processor of controller 109 of FIGS. 1-2) to carry out image processing, data processing, beamlet scanning, database management, graphical display, operations of a charged particle beam apparatus, or another imaging device, or the like. Common forms of non-transitory media include, for example, a floppy disk, a flexible disk, hard disk, solid state drive, magnetic tape, or any other magnetic data storage medium, a CD-ROM, any other optical data storage medium, any physical medium with patterns of holes, a RAM, a PROM, and EPROM, a FLASH-EPROM or any other flash memory, NVRAM, a cache, a register, any other memory chip or cartridge, and networked versions of the same.

As described above, charged particles may be reflected or emitted from people or objects which can be used to obtain information about the structure (e.g., target 208). A charged particle beam, which may otherwise be referred to as a signal beam (e.g., a signal charged particle beam) and/or an incidental charged particle beam, is generated when the primary beam is incident on the target 208 which generates the signal particles, for example backscattered and secondary electrons as described above. It is beneficial to provide a detector which can be used to detect the incidental charge particle beam to obtain information about the target 208.

The incidental charged particle beam may otherwise be referred to as a secondary beam. The incidental charged particle beam may comprise the secondary and/or backscattered electrons. An axis of the incidental charged particle beam may be the same as the incidental charged particle beam path. The incidental charged particle beam path may be interchangeable with the axis of the incidental charged particle beam.

During detection of the charged particles, deformation of components supporting the detector may occur which may move the detector, leading to inaccurate measurements. This may be a greater problem for certain tools, such as multi-beam tools if the detector is larger to allow detection of multiple beams.

In the present disclosure, a detector module may be provided comprising a detector and a support. Reference is now made to FIG. 4A, a schematic diagram illustrating an exemplary detector module 500 and an exemplary support 501. The detector module 500 may be part of the multi-beam system of FIG. 2 and/or FIG. 3. More specifically, the detector module 500 may provide electron detection device 240 which is shown in FIG. 3. As depicted the detector module 500 features support 501

The detector module 500 is suitable for defining at least a part of a wall of a vacuum chamber of a charged particle beam assessment tool. The charged particle beam assessment tool may be at least part of the tool 104 (or apparatus 104). The detector module 500 may be made of multiple components which can be used as part of a wall of the vacuum chamber. The detector module 500 may define at least in part an end of the vacuum chamber. In other words, the detector module 500 may form an end of the vacuum chamber, or more specifically, an end wall of the vacuum chamber. This applies when the detector module 500 is in use and/or in position as part of the tool 104. The detector module 500 may seal the vacuum chamber by providing a sealing cover over an aperture in the vacuum chamber. The detector module 500 may form an end portion of the secondary column. In some embodiments, the source (such as source 201) is at another end, for example in a primary column (which may correspond to the electron-optical column of FIG. 2). The vacuum chamber may be in fluidic communication with other chambers, for example, the primary column and/or a stage chamber. In use, these chambers may all be part of the same vacuum chamber/vacuum chamber environment 530.

The detector 531 is configured to operate in the vacuum chamber (e.g., in vacuum chamber environment 530). It will be understood that the vacuum chamber is a chamber in which the vacuum chamber environment 530 can be provided at some point during operation of the detector module 500. Components (e.g., which are part of tool 104) external to the detector module 500 may be used to provide the vacuum in the vacuum chamber.

Operation of the detector module 500 includes detector operation for detecting signal charged particles (e.g., secondary beams) in order to carry out the main purpose of the detector module 500. Operation of the detector module 500 also includes other operations (e.g., which do not involve operation of the detector 531 for detecting signal charged particles) such as maintenance operations, for example, bake-out during which the vacuum can be generated.

The detector 531 is generally arranged relative to the incidental charged particle beam. The detector 531 is configured to be alignable with an incidental charged particle beam path 535. This means that the detector 531 of the detector module 500 can be positioned to align with the incidental charged particle beam path 535. For example, if the detector module 500 is to be used as an end portion of the secondary column, the incidental charged particle beam will be incident on the detector 531 in use. As mentioned above, the incidental charged particle beam may comprise secondary and/or backscattered electrons. The incidental charged particle beam path 535 may be the main path along which the incidental charged particles (e.g., secondary electrons and/or backscattered electrons) travel after being emitted from the target 208. The incidental charged particle beam path 535 may be substantially centrally located relative to the detector 531 (and specifically relative to a detecting portion of the detector 531).

The support 501 is suitable for defining at least a part of a wall of the vacuum chamber. For example, the support 501 may define at least part of the wall when the detector module 500 is in use and/or in position in part of tool 104. The support 501 may be configured to cover an aperture in the vacuum chamber. The support 501 may be used to seal the vacuum chamber, and particularly to seal an aperture in the vacuum chamber. Therefore, the support 501 may be the part of the detector module 500 which is used to define the wall/end of the vacuum chamber.

The support 501 may comprise a feedthrough 522. The feedthrough 522 may be planar. In other words, the feedthrough 522 may be in the form of a plane, or flat. The feedthrough 522 may be rigid. The feedthrough 522 may be any appropriate material. The feedthrough 522 may be a printed circuit board (PCB). The feedthrough 522 may be used to cover the aperture in the vacuum chamber. The feedthrough 522 may be larger than the aperture in the vacuum chamber. The feedthrough 522 may be a means to provide power and/or electrical connections through the feedthrough 522. The feedthrough 522 may be a printed circuit board (PCB). Providing the feedthrough 522 as a PCB may be beneficial, for example, to aid electrical connections through the board from one side to the other using the integrated electrical connections provided in the structure of the PCB.

The detector 531 may be mounted to the feedthrough 522. The detector 531 may be mounted in any appropriate manner, e.g. using adhesive and/or welding and/or soldering. The detector 531 may be electrically connected through the feedthrough 522. This means that electrical connections may be provided through the feedthrough 522 to which the detector 531 can be connected (e.g., mounted). The electrical connections through the feedthrough 522 can be provided such that the electrical connections connect to the detector 531 on one side of the feedthrough 522 and the electrical connections run through the feedthrough 522 to the other side of the feedthrough 522.

The support 501 may comprise a body, which may be configured to support the feedthrough 522. The body of the support 501 could be provided as a single integral body. In some embodiments, the body of the support 501 is provided as separate parts which are connected together. For example, the support 501 may comprise a ring 521 configured to support the feedthrough 522. The ring 521 may be in contact with the feedthrough 522. The ring 521 may be in contact with the feedthrough via a connecting portion or layer (e.g., via a solder layer and/or an adhesive layer). The feedthrough 522 may cover an aperture of the ring 521. The support 501 may comprise other parts, such as an outer mounting part 519 and an inner mounting part 520. The inner mounting part 520 may be radially inwards of the outer mounting part 519. The support 501 may be mounted via the inner mounting part 520 and/or the outer mounting part 519 to another part of the secondary column, such as to another component of the detector module 500 (for example, via the outer mounting part 519) and/or another part of the secondary column such as the chamber wall of the secondary column. The inner mounting part 520 and/or the outer mounting part 519 may each be configured to be mounted to more than one other component of the secondary column.

The support 501 may be deformed by applied disturbances. This generally occurs during operation of the detector module 500. More specifically, there are specific operations of the detector module 500 in which the support 501 may be deformed by disturbances. For example, bake-out, as described above, is a high temperature process during operation of the detector module 500 which can be used to prepare the detector module 500 for use. Additionally, during operation of the detector 531 for detection of charge particles, some thermal variation may occur which results in applied disturbances which deform the support. Deformation of the support may be temporary and time dependent.

The applied disturbances may apply a force to the support 501 in a variety of different ways, directions and planes which will lead to deformation of the support 501 in a variety of ways. As the detector 531 is mounted to a part of the support 501, deformation of the support 501 generally results in changes to the position of the detector 531 relative to the incidental charged particle beam path 535. Thus, the applied disturbances and resulting deformation of the support 501 may affect the position of the detector 531 relative to the incidental charged particle beam path 535. This may affect the position of the detector 531 in various different ways, for example in a plane of the detector 531, or along the incidental charged particle beam path 535. The applied disturbances could lead to rotation of the detector 531 about the incidental charged particle beam path 535 and/or tilt (e.g., the angle) of the detector 531 out of the ideal detector plane (e.g., orthogonal to the incidental charged particle beam path 535 or the initial calibrated position of the incidental charge particle beam path 535).

The detector module 500 is configured so that the position of the detector 531 during operation of the detector 531 is maintained relative to the incidental charged particle beam path 535. Thus, the detector module 500 is configured to keep the detector 531 in the same position relative to the incidental charged particle beam path 535 taking into account the applied disturbances to the support 501 and/or detector 531 described above. The detector module 500 may comprise active configurations and/or passive configurations for maintaining the detector 531 in position. As described in detail below, various embodiments are provided with different configurations for maintaining the detector 531 in position and these embodiments may be provided separately or in combination.

Generally, the detector module 500 may operate around the incidental charged particle beam so that distortion/deformation of the support 501, and particularly the feedthrough 522, is symmetrical. This may be effected in a number of different ways, for example providing a resilient member, symmetrical positioning of components, and/or the use of a thermal conditioning system. The detector module 500 may be configured so that during operation of the detector module 500, deformation of the support due to thermal variation is symmetric.

Additionally, deformation of the support 501, such as via the resilient member described below, may reduce mechanical stress on the detector 531, for example when the detector module 501 is at an elevated temperature. In other words, the detector module 500 of the present disclosure may beneficially be robust to deformation, for example due to bake-out.

The detector module 500 may comprise in part a wall of the vacuum chamber. This means that when the detector module 500 is positioned as part of the vacuum chamber, it can form of at least part of the vacuum chamber wall. In other words, the detector module 500 is suitable for providing a vacuum environment 530 within the vacuum chamber as it can be used as part of the vacuum chamber. When the detector module 500 is positioned as part of the vacuum chamber, the detector 531 is positioned within the vacuum chamber.

The feedthrough 522 may comprise a first side 522A and a second side 522B. The second side 522B being opposite the first side 522A. The first side 522A may be suitable for exposing to an atmospheric environment 510. The first side 522A may be exposed to the atmospheric environment 510 in operation of the detection module 500. The second side 522B may be suitable for exposing to the vacuum chamber. The second side 522B may be exposed to the vacuum chamber environment 530 in operation of the detection module 500. Thus, the first side 522A might otherwise be referred to as the atmospheric side and/or the second side 522B might otherwise be referred to as the vacuum side.

The second side 522B may be used to cover an aperture in the vacuum chamber, for example an aperture in a wall of the vacuum chamber or an end opening in the vacuum chamber. This means that the feedthrough 522 can be positioned across the aperture (e.g., an opening) in the vacuum chamber with the second side 522B facing the vacuum chamber environment 530. The detector 531 may be positioned on a portion of the second side 522B of the feedthrough 522 that covers the aperture. This means that the detector 531 may be positioned on the feedthrough 522 facing into the vacuum chamber. Thus, the detector 531 may be positioned in the vacuum chamber environment 530 and would also be positioned in the opening of the wall of the vacuum chamber. The detector 531 may be mounted in any appropriate manner to the second side 522B, for example using adhesive and/or welding and/or soldering.

The detector module 500 may comprise a resilient member 514. As described below, the resilient member 514 may be provided in different areas and examples of a first type resilient member 514A and a second type resilient member 514B are described below. Reference to the resilient member 514 could apply to the first type resilient member 514A, the second type resilient member 514B or both.

The resilient member 514 may be a passive component used to maintain the position of the detector 531 relative to the incidental charged particle beam path 535. In other words, the resilient member 514 may be used to maintain the position of the detector 531 without any additional control provided to the resilient member 514. The resilient member 514 may be beneficial in helping to reduce or avoid misalignment of the detector 531. The resilient member 514 may support the detector 531 so as to allow the detector 531 to "breath" and maintain alignment with the incidental charged particle beam path 535, even though distortions may occur due to applied disturbances such as thermal load. This means that alignment and adjustments made at one temperature, for example in operation, such as detection operation, can be maintained during certain operations such as a maintenance operation when a disturbance is applied to the detector module such as pressure and/or thermal. And when such temperature disturbances are removed, for example when reverting to a detection operation from a maintenance operation, the detector maintains its position, and, if there is a shift in position of the detector between a detection operation and a maintenance operation, such shift is reversed which changing the conditions of the detector module for the detection operation. The resilient member 514 may be configured so as to allow even distribution of the applied disturbances over the resilient member 514.

The resilient member 514 may be provided in various different forms. For example, the resilient member 514 may be a flexure and/or a leaf-spring. The resilient member 514 may be connected to any appropriate part of the support 501 which allows deformation of the support 501 to be counteracted by variation in the movement of the resilient member 514. The resilient member 514 may distort, for example under a heat load, substantially about the incidental charged particle beam path 535 so that the position of the detector 531 mounted to the feedthrough 522 can be maintained relative to the incidental charged particle beam path 535.

The resilient member 514 may be used to support feedthrough 522. The resilient member 514 may surround feedthrough 522. In other words, the resilient member 514 may be positioned radially outwards of the feedthrough 522. The resilient member 514 may be annular, for example, a ring. The resilient member 514 may connect the feedthrough 522 to other parts of the support 501 or components outside of the detector module 500. The resilient member 514 may be provided within or on the support 501, as described further below.

The resilient member 514 may be configured so that during operation of the detector 531, deformation of the support due to disturbances is symmetric relative to the incidental charged particle beam path 535. The resilient member 514 may be configured in this way due to movement of the resilient member 514 in response to deformation of the support 501. This is beneficial in that the resilient member 514 can reduce or prevent mechanical stress on the feedthrough 522 and/or detector 531 which may otherwise result due to deformation of the support 501.

The resilient member 514 may be configured to move in a single direction. In other words, the resilient member 514 may be compliant in one direction. As described in relation to the first type resilient member 514A, the resilient member 514A may be compliant in the radial direction. In some embodiments, the detector 531 is designed at an assumed thermal center, that matches with charged particle beam path 535 and the resilient member 514 is designed such that it is compliant in a radial inwards/outwards direction with respect to the thermal center. As described in relation to the second type resilient member 514B, the resilient member 514B may be compliant in the direction of the incidental charged particle beam path 535.

Figure 4B:
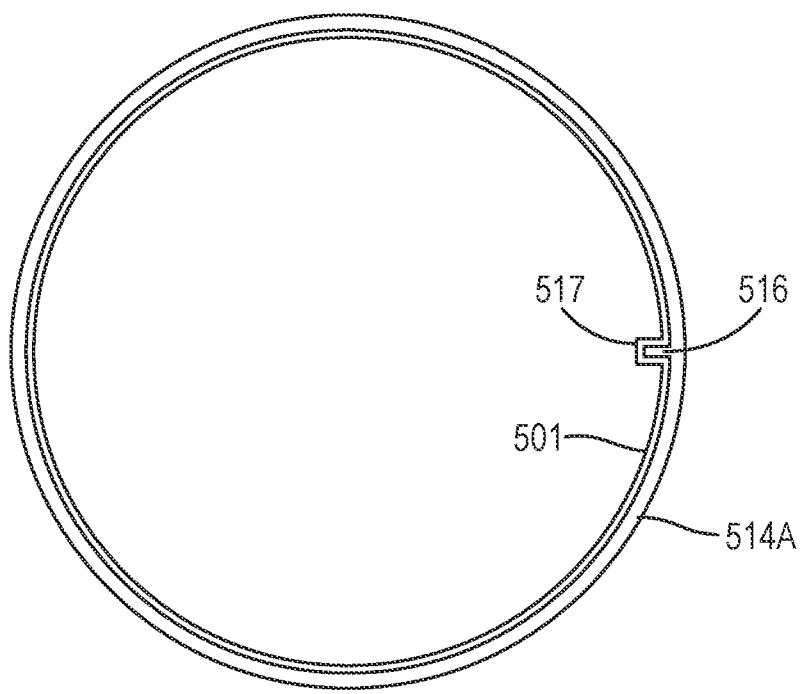
FIG. 4B is a schematic diagram illustrating an exemplary resilient member.

Movement of the resilient member 514 in at least one direction may be restricted, for example, by a mechanical feature. For example, movement of the resilient member 514 may be restricted in the circumferential direction. The resilient member 514 may comprise a mechanical feature to prevent misalignment of the detector 531 being induced. For example, the resilient member 514 may comprise an alignment pin, otherwise referred to as a protrusion, which can provide such a mechanical feature. An exemplary alignment pin 516 is shown in FIG. 4B, which is an exemplary cross section through a resilient member 514 (e.g., resilient member 514A in FIG. 4A). As shown, the support 501 comprises a recess 517 configured to mate with the protrusion 516 to prevent relative rotation between the support 501 and the resilient member 514 around the incidental charged particle beam path 535. Thus, mating components of the support 501 and the resilient member 514 may prevent movement of the resilient member 514 in certain directions, such as the circumferential direction. This can be beneficial in addressing rotational distortions. The recess 517 is shown as radially inwards of the resilient member and the alignment pin 516 is on a radially inner surface of the resilient member 514. However, the alignment pin 516 could be on a radially outer surface of the resilient member 516 and the corresponding recess 517 could be positioned radially outwards of the alignment pin 516.

The alignment pin 516 may extend along an edge of the resilient member 514. The alignment pin 516 may be an elongated member. The alignment pin 516 may be substantially parallel to the beam path 535, for example when provided as part of the resilient member 514A. If the resilient member 514B comprises as alignment pin (not shown), it may be formed in a substantially radial direction. Thus, the alignment pin may be substantially perpendicular to the beam path 535 (e.g., parallel to plane 536).

Although the resilient member 514 is shown as comprising the alignment pin 516 and the support 501 comprising the corresponding recess 517, this may be the other way round (e.g., the resilient member 514 may comprise a recess and the support member may comprise a corresponding alignment pin). In these various configurations, the alignment pin can be used to prevent rotation of the respective resilient member relative to the support 501 around the beam path 535.

The resilient member 514 may be formed as a single body. In other words, the first type resilient member 514A and/or the second type resilient member 514B may each be provided as a single body. The resilient member 514 may be provided as a single integral body of one material. In some embodiments, the resilient member 514 may be provided as a single body of two or more parts (e.g., two parts which are attached to each other to form a single body). The single body may be formed by two parts which are of different materials to each other. Thus, the resilient member 514 may be formed of two or more different materials.

The resilient member 514 may be provided as two or more bodies, for example as two or more separate resilient portions. In other words, the first type resilient member 514A and/or the second type resilient member 514B may each be provided as multiple bodies. Thus, the resilient member 514 may comprise multiple resilient portions, for example, which are positioned in an annular shape (e.g., a ring shape) around the incidental charged particle beam path 535. For example, the resilient member 514 may be formed of separated portions radially spaced around the feedthrough 522. The resilient member 514 may comprise a plurality of resilient members and the plurality of resilient members may be positioned surrounding the feedthrough 522 in a symmetric formation (e.g., a rotationally symmetric formation). In other words, the plurality of resilient members may be positioned surrounding the feedthrough 522 such that they are at a given distance from the feedthrough 522 and equidistant to each other. In some instances, the separate resilient portions of one resilient member 514 may be positioned in a substantially ring-shaped formation.

The resilient member 514 may be symmetrical. The resilient member 514 may be ring-shaped, and may otherwise be referred to as circular. The resilient member 514 may have any appropriate shape which can be provided surrounding the feedthrough 522. The resilient member 514 may be positioned so that it is symmetric relative to the incidental charged particle beam path 535.

The resilient member 514 may be positioned so that it is rotationally symmetric relative to the incidental charged particle beam path 535. This is described in further detail below.

The resilient member 514 may be any appropriate material. In some embodiments, the resilient member has lower thermal conductivity. In some embodiments, the resilient member 514 has lower thermal conductivity than the thermal conductivity of the material to which it is attached (e.g., the support 501), such that the resilient member 514 reduces or minimizes transfer of heat across the resilient member 514.

The resilient member 514 may be provided within the support 501. Thus, the resilient member 514 may provide a component in a mechanical chain from the detector 531 to a part of the detector module 500 mounted to another component, such as a wall of the vacuum chamber for example of the secondary column. The feedthrough 522 may be supported by a part of the support 501 (e.g., the ring 521 in connection with the inner mounting part 520) and a further part of the support 501 (e.g., the outer mounting part 519) may be used to attach to other parts of a vacuum chamber. For example, as shown in relation to the first type resilient member 514A, the resilient member 514A may connect the first part of the support 501 to the second part of the support 501 to allow movement of the first part of the support 501 relative to the second part of the support 501. For example, the resilient member 514A may be provided to connect the inner mounting part 520 to the outer mounting part 519. The resilient member 514 could be provided between the ring 521 and the inner mounting part 520. The resilient member 514 could be positioned between any internal components of the support 501 which allows a part of the support 501 to move relative to another part of the support 501. In particular, the resilient member 514 may be provided between the feedthrough 522 and a part of the support 501 connected to a component external to the detector module 500.

In some embodiments, the resilient member 514 may be provided as part of a connection between the support 501 and a component external to the detector module 500. For example, as shown in relation to the second type resilient member 514B, the resilient member 514B may be provided on an outer wall of the support 501. The resilient member 514B may provide a connection between the support 501 and another external component (e.g., a part of the vacuum chamber). This may allow the support 501 to move relative to the external component.

The resilient member 514 may be compliant in the radial direction, which means that the resilient member 514 can move in the radial direction. The radial direction may be orthogonal to the incidental charged particle beam path 535, such that the resilient member 514 can move inwards and outwards relative to the incidental charged particle beam path 535, as shown by the first type resilient member 514A. Thus, the resilient member 514A may be configured to move in a direction radially inwards and outwards in plane 536 perpendicular to the incidental charged particle beam path 535. Thus, the resilient member 514 may be used to address radial distortions.

The resilient member 514 may be compliant in the direction of the incidental charged particle beam path 535 (e.g., the resilient member 514 may move in a direction substantially parallel to the incidental charged particle beam path 535), as shown by the second type resilient member 514B. Thus, the resilient member 514B may be configured to move in a direction parallel to the incidental charged particle beam path 535 (e.g., along the incidental charged particle beam path 535). The support 501 may comprise a flange 515 for securing the support 501 to a wall of the vacuum, and/or any component external to the detector module 500. The resilient member 514B may be provided on the flange 515 (e.g., on an external wall of the support 501). The flange 515 may be used to anchor the resilient member 514B.

Only one of the two resilient members 514A and 514 B described above may be provided. In some embodiments, both the resilient members 514A and 514B may be provided. The resilient members 514A and 514B may be positioned in different parts of the support 501. Each of the resilient members 514A and 514B may be provided in different positions on or in the support 501.

The detector module 500 may comprise a rigid body 511 as shown in FIG. 4A. The rigid body 511 may be mounted to the feedthrough 522. The rigid body 511 may be mounted on the feedthrough 522 using any appropriate connecting material (e.g., an adhesive layer). The rigid body 511 may be positioned on the feedthrough 522 on a side of the feedthrough 522 which is opposite to the detector 531. The rigid body may be on the first side 522A of the feedthrough, which is suitable for exposing to an atmospheric environment 510.

The rigid body 511 may be configured so that during operation of the detector 531, deformation of the support is symmetric relative to the incidental charged particle beam path 535. This is described in further detail below.

The rigid body 511 may provide support to the feedthrough 522. This may be beneficial in reducing or preventing deformation of the feedthrough 522 (e.g., due to a pressure difference between the two sides of the feedthrough 522). Such a pressure difference will occur when there is a vacuum environment 530 on one side of the feedthrough 522 and an atmospheric environment 510 on the other side of the feedthrough 522.

The detector module 500 may comprise a thermal conditioning system. The rigid body 511 may be at least part of a thermal conditioning system. An exemplary thermal conditioning system 650 is shown in further detail in FIG. 7. The rigid body 511 may be at least part of the thermal conditioning system 650. Cross-sections X1, X2 and X3 through the thermal conditioning system 540 of FIG. 7 are provided in FIG. 8A, FIG. 8B, FIG. 9A, and FIG. 9B. The thermal conditioning system 650 may be an example of an active configuration which can be used to maintain the position of the detector 531 relative to the incidental charged particle beam path. As described in relation to the rigid body 511, the thermal conditioning system 650 may be configured so that during operation of the detector 531, deformation of the support 501 (e.g., due to thermal variation) is symmetric relative to the incidental charged particle beam path 535.

Alignment and adjustments made by conditioning the system using the thermal conditioning system 650 may be applied at certain temperatures and/or in certain conditions. For example, alignments and adjustment made at one temperature, for example in detection operation, can be maintained during certain operations such as a maintenance operation when a disturbance is applied to the detector module such as pressure and/or thermal. And when such temperature disturbances are removed, for example when reverting to a detection operation from a maintenance operation, the detector maintains its position, and, if there is a shift in position of the detector between a detection operation and a maintenance operation, such shift is reversed which changing the conditions of the detector module for the detection operation. The thermal conditioning system 650 may be configured to thermally condition the detector during certain operations (e.g., detection operation). In this case, the thermal conditioning system may be configured to position the detector in the same position during detection operation (despite any changes in position which may occur in the maintenance operation) as described above.

The thermal conditioning system 650 may be beneficial in providing a uniform distribution of thermal conditioning and stable thermal conditioning. The thermal conditioning system 650 may beneficially be provided in such a way that it fits in a limited space, such as in combination with the secondary column. As described above, heat may be generated (e.g., during operation of the detector 531) at least by electronics (which may be proximate to the detector 531) and by the interaction of the detector 531 with incoming charged particles, such that the thermal conditioning system 650 can usefully reduce or prevent inaccurate positioning which might otherwise arise as a result of the thermal load. Thus, the thermal conditioning system 650 is beneficial in reducing or avoiding distortion arising as a result of the thermal load and can be used to maintain the position of the detector 531 relative to the incidental charged particle beam path 535.

The thermal conditioning system 650 may deliver and recover conditioning fluid towards a part of the detector module 500 comprising the detector 531 in such a way that the position of the components forming the relevant circuit(s), for example a continuous duct or a plurality of ducts of the thermal conditioning system 650, does not interfere with other components, such as the resilient member 514 if present. The thermal conditioning fluid may have a relatively high heat capacity, for example water. In some embodiments, the thermal conditioning system 650 is provided in such a way that the support 501 and/or detector 531 can be thermally conditioned whilst also allowing proximity of the electronics to the detector 531. In some embodiments the thermal conditioning system operates at least during detection operation.

The thermal conditioning system 650 may be a fluid conditioning system, for example which uses conditioning fluid. The thermal conditioning system may be configured to thermally condition the support 501. The thermal conditioning system 650 may be configured to thermally condition the detector 531, at least indirectly. The thermal conditioning system 650 may be configured to transfer heat from the support 501. As the thermal conditioning system is configured to transfer heat from the support 501, it may thereby transfer heat from the detector 531. Various configurations may be used for the thermal conditioning system 650.

In some embodiments, the thermal conditioning system 650 provides thermal conditioning of the support 501 and/or detector 535 such that deformation of the support 501 is symmetrical with respect to the incidental charged particle beam path 535 and to reduce or limit the distortion of the support 501 for example induced by disturbances (e.g., thermal disturbances). If thermal conditioning were not applied then the deformation might exceed a thermal threshold under which disturbances would be substantially symmetrical, thus, without thermal conditioning then non-symmetric deformation due to thermal disturbances may be more likely to occur.

For example, the thermal conditioning system 650 may supply fluid over the feedthrough 522 in a symmetrical and/or even manner. The thermal conditioning system 650 may supply fluid over a central portion of the feedthrough 522. The central portion of the feedthrough 522 may correspond to the area in which the charged particle beam is directed and/or where the detector 531 is positioned. In some embodiments, the thermal conditioning system 650 provides fluid over a location of the detector 531 (e.g., on a side of the feedthrough opposite to the detector 531). This is beneficial in that it provides thermal conditioning to a portion of the feedthrough which may experience greater heat load due to the proximity of the detector 531. In some embodiments, the thermal conditioning system provides fluid evenly over a location of the detector 531. The feedthrough 522 is configured to conduct heat through the feedthrough 522 to ensure the detector 531 is conditioned. This may be implemented by selecting a material for the feedthrough 522 with good thermal conductivity. In some embodiments, the feedthrough 522 may comprise thermal conducting structures through the feedthrough 522 which allow heat to be conducted from one side of the feedthrough 522 to the other. For example, such thermal conditioning structures may be electrical wiring in the feedthrough 522.

The thermal conditioning system 650 may comprise a supply connection 651 and/or a recovery connection 652. The supply connection 651 may be a form of connection from which fluid is provided/delivered during use. More specifically, the supply connection 651 can be used to supply fluid for thermally conditioning the feedthrough 522. The recovery connection 652 may be a form of connection through which fluid is recovered during use. More specifically, fluid used to thermally condition the feedthrough 522 can be recovered via the recovery connection.

In some embodiments there is a single supply connection 651 and/or a single recovery connection 652 as this is less likely to experience turbulence. However, it is noted that multiple supply connections 651 and/or multiple recovery connections 652 may be provided and are interchangeable with any reference to the single supply connection 651 and/or a recovery connection 652.

The supply connection 651 and recovery connection 652 can be positioned in various different ways. The supply connection 651 and recovery connection 652 may be positioned on the same side of the feedthrough 522, and more specifically, in the atmospheric environment 610. The supply connection 651 and recovery connection 652 may be positioned symmetrically relative to the support 501. The supply connection 651 and recovery connection 652 may be positioned opposite each other relative to the geometrical axis of the support relative to the direction of the secondary beam path. The supply connection 651 and the recovery connection 652 may be positioned in a central region of the feedthrough 522. The supply connection 651 and the recovery connection 652 may be at radially outward positions compared to the incidental charged particle beam path 535. The supply connection 651 and recovery connection 652 may be positioned to be symmetrical about a plane comprising the incidental charged particle beam path 535, the plane being orthogonal to the feedthrough 522.

Such a thermal conditioning system is likely to generate and propagate vibrations along the fluid conditioning path. In some embodiments, electronics which may be associated with (e.g., thermally conditioned by) part of the thermal conditioning system 650 may also generate vibrations. The conditioning fluid may be an incompressible fluid (e.g., water) which is more likely to propagate vibrations. Having the connections on either side (e.g., with the supply connection 651 and the recovery connection 652 positioned symmetrically and/or opposite each other as described above) means that aspects of such vibrations are 'balanced'—equal and opposite forces are applied to extreme and positioned equally distanced from the axis and/or path. Therefore the vibrations would be applied more symmetrically around the support than otherwise.

Figure 8A:
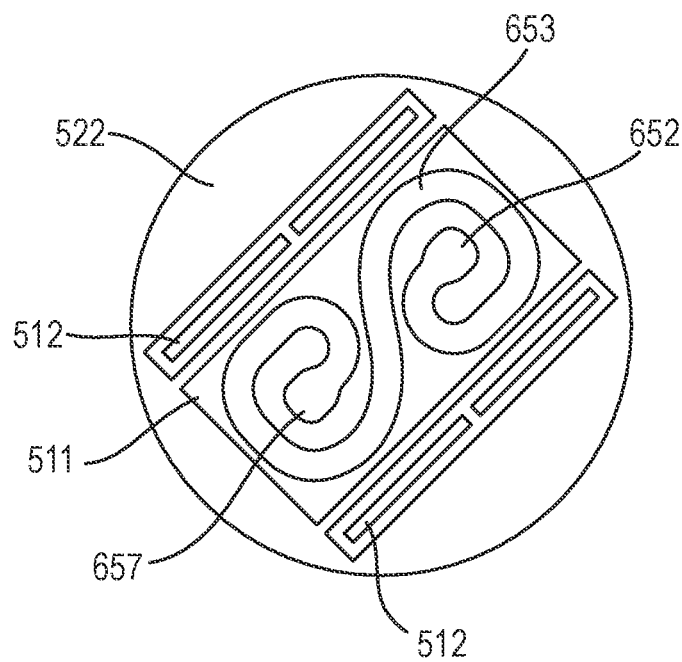
FIG. 8A and FIG. 8B are schematic diagrams illustrating cross-sections through the detector module as shown in FIG. 7 which depict variations of the detector module consistent with embodiments of the present disclosure.
Figure 8B:
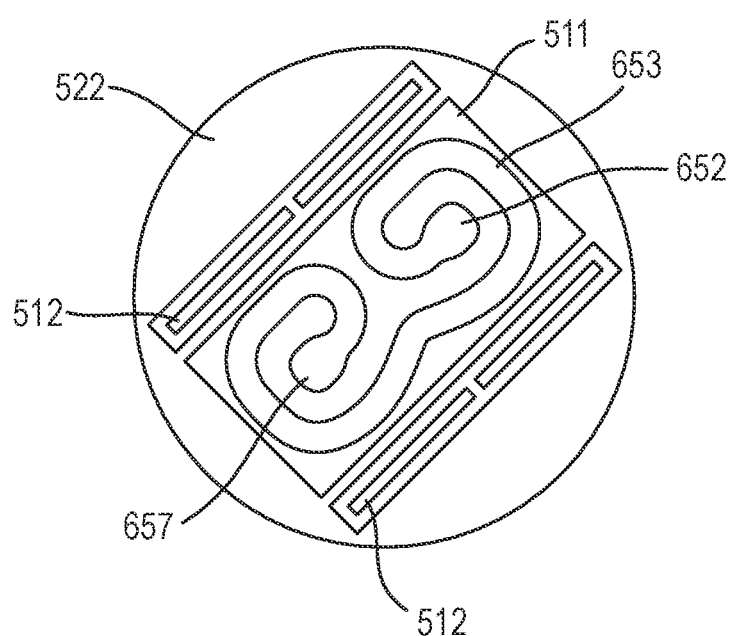

The thermal conditioning system 650 may additionally define at least part of a channel 653 as shown in FIG. 7, FIG. 8A, and FIG. 8B. The channel 653 may otherwise be referred to as a conduit or duct. The thermal conditioning system 650 may be configured to provide conditioning fluid through the channel 653 to thermally condition the feedthrough 522. The thermal conditioning system 650 may be configured to provide even and stable thermal conditioning via the channel 653. This can be improved by the positioning of the fluid supply connection 651, the fluid recovery connection 652 and/or the shape of the channel 653. As described, the thermal conditioning system 650 may be configured to providing the conditioning fluid through the channel 653 to transfer heat from the feedthrough 522. In some embodiments, during operation of the detector module 500, deformation of the support 501 (e.g., due to thermal variations) is symmetric relative to the incidental charged particle beam path 535.

The channel 653 may be positioned relative to the feedthrough 522 to affect the way in which heat is transferred from the feedthrough 522. In some embodiments, thermal conditioning using the channel 653 can allow deformation of the support 501 relative to the incidental charged particle beam path 535 to be symmetrical.

The thermal conditioning system 650 may define at least part of the channel 653. Thus, the channel 653 may be part of the thermal conditioning system 650. The channel 653 may be positioned adjacent to the feedthrough 522. The channel 535 may be formed inside the thermal conditioning system 650. The channel 535 may be formed inside the rigid body 511. In some embodiments, the channel 653 may be partially formed by the feedthrough 522 (e.g., if the feedthrough 522 provides at least part of a wall of the channel 653) and the rigid body 511 may form part of a wall of the channel 653. Thus, the channel 653 may be formed by the thermal conditioning system 650 (and specifically the rigid body 511) and the feedthrough 522 in combination. In this case, walls of the channel 653 may be provided by the thermal conditioning system 650 (and specifically the rigid body 511) and the feedthrough 522.

The channel 653 may be positioned in a central region of the feedthrough 522. The channel 653 may be positioned on the feedthrough 522 opposite to the detector 531 mounted on the other side of the feedthrough 522 (even when provided in the thermal conditioning system 650 or rigid body 511). The channel 653 may be any appropriate shape. For example, the channel 653 may be provided in a curved path shape, for example as shown in either of FIG. 8A or FIG. 8B, which are cross-sections through X1 in FIG. 7. In some embodiments, the channel 653 is provided in a sinusoidal shape (e.g., a sigmoid curve shape) which may otherwise be referred to as an s-shape, as shown in FIG. 8B. In some embodiments, the channel 653 is shaped to provide laminar flow within the channel 653 (e.g., to reduce or avoid turbulent flow). This may be effected by smooth sides within the channel 653 and/or a shape of the channel 653 being selected which is curved and avoids sharp corners. Laminar flow is preferable to turbulent flow because turbulent flow may be source of disturbances during detector operation. The shape of the channel 653 is further discussed below.

The thermal conditioning system 650 may comprises a rigid plate. The rigid plate may be beneficial in providing support to the feedthrough 522 and/or acting as a heat spreader. The rigid plate could be part of, or integrated with, the rigid body 511. The rigid plate could replace the rigid body 511 shown in FIG. 8A or FIG. 8B. The channel 653 may be formed on, or as part of the rigid plate. The rigid plate may be in contact with, or adjacent to, the feedthrough 522. The rigid plate may be in contact with, or adjacent to, the side of the feedthrough 522 opposite the device 531 (e.g., the first side 522A of the feedthrough 522). Therefore, the rigid plate may be close to the detector 531. The feedthrough 522 may be in between (e.g., sandwiched between) the rigid plate and the detector 531. In some embodiments, the rigid plate is positioned outside the vacuum chamber environment 530. The rigid plate may be beneficial in providing mechanical support to reduce or prevent deformation of the detector 531 and/or feedthrough 522 (e.g., due to pressure difference in the detector module). The thermal conditioning system 650 may be configured to provide even and stable thermal conditioning over the plate. This may be beneficial in providing even and stable conditioning of the feedthrough 522. The channel 653 may be in direct contact with the rigid plate. In some embodiments, the thermal conditioning system 650 may not comprise a rigid plate.

The detector module 500 may further comprise an electronics unit 670. The electronics unit 670 may comprise electronics configured to be in signal communication with the detector 531 (e.g., for controlling the detector 531 and/or receiving data from the detector 531). At least the electronics unit 670 may comprise connections to the support 501. Similarly, the support 501 may comprise connections to the electronics unit 670. The connections on the electronics unit 670 and the support 501 may function as a plug and socket arrangement.

In some embodiments, the electronics unit 670 is supported by the support 501 and/or the thermal conditioning system 650, for example at least during maintenance operations. In some embodiments the electronics unit 670 is spaced apart from the support 501, optionally close to the support 501. For example, the electronics unit 670 may be mounted on, or connected to, a part of the thermal conditioning system 650 and may be held in place by the thermal conditioning system 650 (e.g., a housing 680 of the thermal conditioning system 650). The electronics unit may thus be spaced apart from the detector (mounted to a part of the support) and/or the feedthrough 522 (which is part of the support). It is beneficial for the electronics unit 670 to be spaced apart from the support 501 because this reduces or avoids forces exerted by the electronics unit 670 (e.g., due to thermal variation) from impacting the support 501 and thus, affecting the detector position 531. Such forces may be a type of disturbance force. A source of such forces may be the stress applied between the electronics and the support 501 should they be in contact due to thermal difference between the detector and the electronics. The electronics may be an additional heat load and to have their supporting structures in direct connection would risk direct transmittance of the heat generated by the electronic in operation to the detector. Spacing them apart contributes to a thermal barrier. In view of the conditioning fluid through the thermal conditioning system, having the electronics spaced apart from the detector assists in reducing if not preventing any vibrations in the electronics unit, such as generated in the fluid conditioning system, from being transmitted to the detector. The electronics unit 670 and/or the electrical connections connecting to the electronics unit 670 may be symmetrically positioned relative to the incidental charged particle beam path. The symmetrical arrangement may suppress the transmission of disturbances such as vibrations towards the detector for example in view the symmetrical design of the support 501.

In some embodiments, the electronics unit 670 is as close as possible to the detector 531 to provide shorter signal paths, thereby reducing attenuation of the signals from detector 531 for example to the electronics unit to which the detector is electrically connected. Of course, this will be limited by other component which are provided as part of the detector module 500.

The electronics unit 670 may be provided with any of the embodiments described herein. When provided in embodiments with the thermal conditioning system 650, the thermal conditioning system 650 may be configured to thermally condition the electronics unit 670 in addition to, or alternatively to, other components which may be thermally conditioned by the thermal conditioning system 650. The thermal conditioning system 650 may be configured to transfer heat from the electronics unit 650. The position of the fluid supply connection 651 and/or the fluid recovery connection 652 on the feedthrough may be selected so as to allow electrical connections to be provided on the feedthrough 522. The detector module 500 may be configured to provide electronic connections (e.g., to connect to the electronics unit 670) and the thermal conditioning connections on the same side of the feedthrough 522. The detector module 500 may be configured to provide the electronic connections and the fluid conditioning connections in close proximity to the detector 531 (on the other side of the feedthrough to the detector). In some embodiments, this means that the electrical connections and the fluid supply connections can be as close as possible to the detector 531 and can fit between other components and connections. Additionally, this allows for a smoothly curved flow path for the conditioning fluid— as shown in FIG. 7, FIG. 8A, FIG. 8B, and FIG. 9A—which can suppress the generating of vibrations through turbulence.

Figure 5:
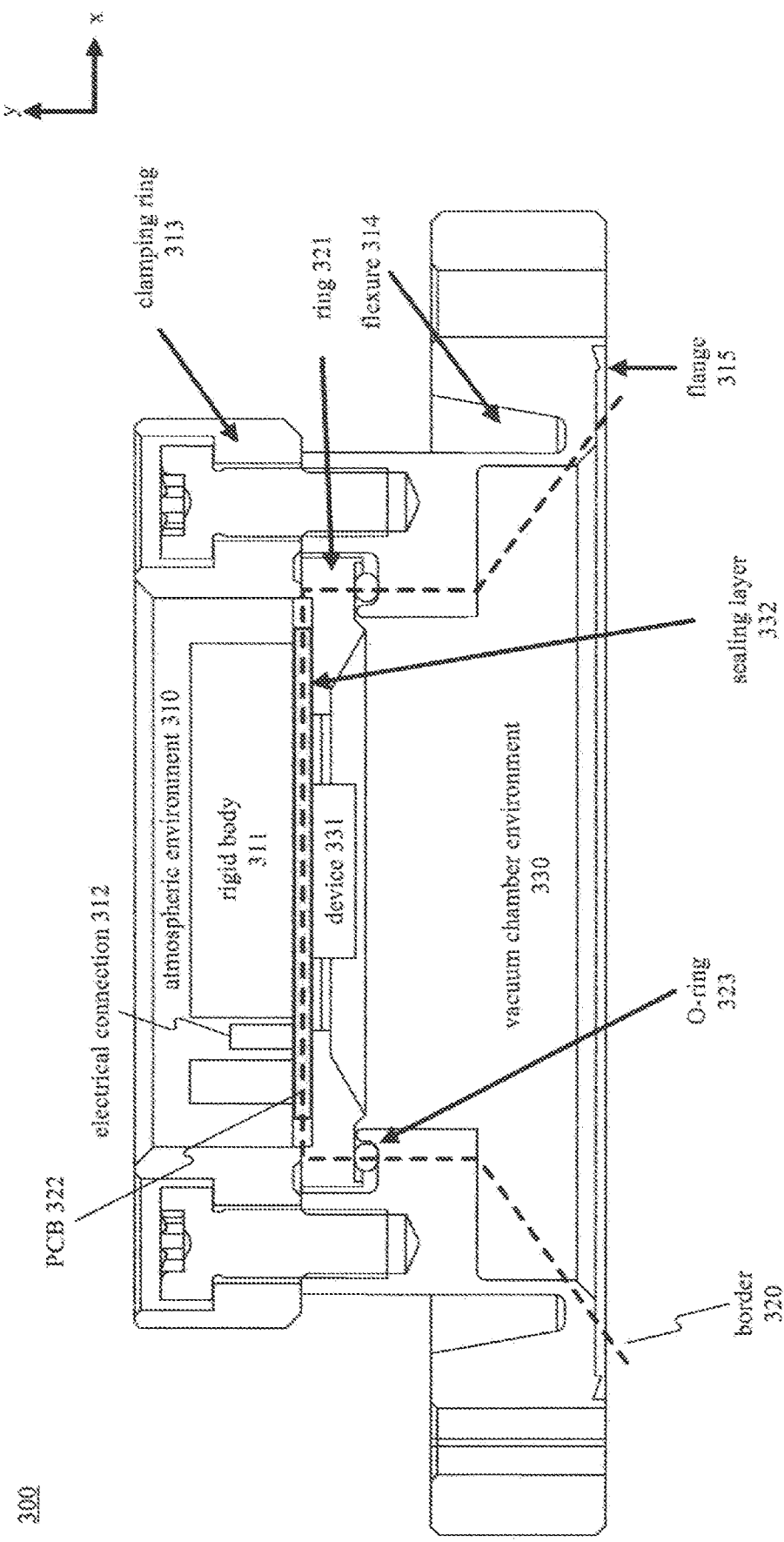
FIG. 5 is a schematic diagram illustrating an exemplary vacuum system that is part of the exemplary multi-beam system of FIG. 2 and/or FIG. 3, consistent with embodiments of the present disclosure.

Reference is now made to FIG. 5, a schematic diagram illustrating an exemplary vacuum system 300 that is part of the exemplary multi-beam system of FIG. 2 and/or FIG. 3, consistent with embodiments of the present disclosure. The description in relation to FIG. 5 provides embodiments and details of a detector module 300. The details shown and described in relation to FIG. 5 may be used in combination with the details described and shown above in relation to the previous figures. In other words, the features shown and described in relation to FIG. 4A and FIG. 4B above are interchangeable with the features shown and described in relation to FIG. 5 and/or FIG. 6 below.

Vacuum system 300 may include an atmospheric environment 310 and a vacuum chamber environment 330, where border 320 illustrates a border between atmospheric environment 310 and vacuum chamber environment 330. The vacuum system 300 may correspond to a version of the detector module 500 described above. The atmospheric environment 310 may be the same as the atmospheric environment 510 described above. The vacuum chamber environment 330 may be the same as the vacuum chamber environment described above. The detector module 500 may comprise a border 320 as described in relation to FIG. 5. It should be noted that border 320 is used for illustrative purposes and is not physically part of the vacuum system. A PCB 322 may be provided. The PCB 322 described herein may correspond to a version of the feedthrough 522 described above. The PCB described here could be replaced with a more general feedthrough 522. The feedthrough 522 may comprise any or all of the features described in relation to the PCB 322. The PCB 322 may be provided on border 320 to form an interface between atmospheric environment 310 and vacuum chamber environment 330 such that vacuum chamber environment 330 may be hermetically sealed, thereby advantageously preventing contaminants (e.g., water vapor, air molecules, etc.) from leaking into vacuum chamber environment 330. For example, a first side of PCB 322 may be exposed to atmospheric environment 310 while a second side of PCB 322, opposite to the first side, may be exposed to vacuum chamber environment 330. The first side of the PCB may correspond to the first side 522A of the feedthrough and the second side of the PCB may correspond to the second side 522B of the feedthrough. The hermetic seal provided by PCB 322 may allow vacuum chamber environment 330 to reach a predetermined pressure in a shorter amount of time by preventing contaminants from entering vacuum chamber environment 330, thereby increasing throughput of an inspection system. Additionally, the hermetic seal provided by PCB 322 may increase the life of the inspection system by preventing contaminants from contacting components (e.g., pure aluminum components, high voltage components, charged particle source component, etc.) in vacuum chamber environment 330.

A device 331 may be provided in an aperture of a ring 321 on the second side of PCB 322. The device 331 is a more general version of detector 531 and the detector 531 may more generally be provided as device 331. The detector 531 and the device 331 may be interchangeable. PCB 322 may cover the aperture of ring 321 such that device 331 may be provided in and operated while exposed to vacuum chamber environment 330. The ring 321 may correspond to the ring 521 described above in relation to the support 501. In some embodiments, PCB 322 covering the aperture of ring 321 may include PCB 322 filling the aperture of ring 321. Device 331 may be a component of electron beam tool 104 of FIG. 3 (e.g., detection device 240 of FIG. 3). In some embodiments, device 331 may be directly connected to the second side of PCB 322. Device 331 may include a plurality of devices, which may be the same devices or a variety of different devices. The hermetic seal provided by PCB 322 may increase the life of device 331 by preventing contaminants from entering vacuum chamber environment 330 from atmospheric environment 310 and contacting device 331.

PCB 322 may include a material that may reduce or minimize a thermal resistance between device 331 and PCB 322. For example, PCB 322 may include a material (e.g., insulators, ceramics, alumina, SiN, etc.) having a coefficient of thermal expansion (CTE) that is substantially similar to the CTE of device 331 (e.g., the CTE of PCB 322 may be similar to or the same as the CTE of device 331). The CTE measures the change in size of material per degree change in temperature. Thus, choosing a material for PCB 322 having a CTE that is at least similar to a material of device 331 may advantageously reduce strain on PCB 322 and device 331, thereby maintaining the quality of the inspection system after high temperature processes (e.g., baking cycles). For different applications, PCB 322 may have different shapes when viewed in the y-direction (e.g., round, hexagonal, rectangular, etc.) in order to strengthen the interface between atmospheric environment 310 and vacuum chamber environment 330.

In some embodiments, a rigid body 311 may be provided on the first side of PCB 322 for exposure to atmospheric environment 310 such that PCB 322 is mounted to rigid body 311. The rigid body 311 may correspond to the rigid body 511 described above, which are interchangeable. Rigid body 311 may extend over the walls of ring 321 (e.g., the walls of ring 321 may be material that forms an aperture of ring 321 and the material may surround the aperture of ring 321) such that rigid body 311 may provide mechanical support to PCB 322 in order to reinforce the hermetic seal provided by PCB 322, thereby allowing PCB 322 to withstand vacuum forces from vacuum chamber environment 330. For example, the force acting on rigid body 311 due to gravity (e.g., the weight of rigid body 311) may be a downward force exerted on PCB 322 and the walls of ring 321. The mass of rigid body 311 may be greater than that of PCB 322 such that the gravitational force exerted on rigid body 311 may provide mechanical support to PCB 322 and reinforce the hermetic seal provided by PCB 322. In some embodiments, rigid body 311 may include a plurality of rigid bodies. In some embodiments, electrical connection 312 may be positioned on the first side of PCB 322. The electrical connection 312 may correspond to electrical connection 512 described above, which is interchangeable.

Electrical connection 312 may be electrically connected to device 331 by PCB 322. In some embodiments, electrical connection 312 may include a plurality of electrical connections.

The rigid body 311 may be at least part of the thermal conditioning system 650 as described above and may have any of the above described variations. Rigid body 311 may be a cooling system (e.g., liquid cooling system, natural air cooling system, forced air cooling system, Peltier cooling system, etc.) that may be configured to transfer heat between rigid body 311 and device 331. For example, PCB 322 may be configured to provide an interface between rigid body 311 and device 331. In some embodiments, PCB 322 may be configured to provide a thermal connection between rigid body 311 and device 331 such that heat may transfer through PCB 322 between rigid body 311 and device 331 or vacuum chamber environment 330 during high-temperature processes or other processes where device 331 (e.g., opto-electric components such as position sensors, mirrors, motors, detectors, etc.) dissipates heat during inspection, thereby preventing premature failure of device 331 or other components due to excessive heat exposure. Rigid body 311 may advantageously prevent fatal errors during manufacturing or inspection by transferring heat from and preventing failure of device 331. For example, even slight changes in temperature exposure to device 331 (e.g., detection device 240 of FIG. 3) may reduce the collection efficiency of signal electrons, such as secondary (SE) and backscattered electrons (BSE), thus adversely affecting the throughput and inspection yield. Additionally, rigid body 311 may advantageously occupy less space in the inspection system and provide more structural symmetry than separate cooling feedthroughs and reduce the need for adjustments to the inspection system during high-temperature process, thereby reducing stage positioning error and beam placement accuracy error.

In some embodiments, sealing layer 332 (e.g., solder) may be provided between the walls of ring 321 and the second side of PCB 322 in order to reinforce the hermetic seal provided by PCB 322 and rigid body 311. Sealing layer 332 may include at least one sealing layer and may be provided on a single side of PCB 322 such that sealing layer 332 is positioned between the walls of ring 321 and the second side of PCB 322. Sealing layer 332 could be provided in the detector module 500 described above.

In some embodiments, PCB 322 may include a plurality of layers. Each of the plurality of layers may include at least one of a via or a trace, thereby providing an electrical connection between electrical connection 312 and device 331. Each via may be filled with conductive material and may extend through a portion, but not the entirety, of PCB 322 in the y-direction in order to prevent leakage between atmospheric environment 310 and vacuum chamber environment 330 and provide shorter signal paths, thereby reducing attenuation of the signals from device 311. Each trace in PCB 322 may be configured to maintain signal integrity such that transmission lines are formed to route high speed signals between, for example, electrical connection 312 and device 331. PCB 322 may include grounding and shielding structures in a multilayer structure.

In some embodiments, vacuum system 300 (and/or the detector module 500) may include structural components such as (in a non-limited list) fixing, securing, resilient and/or sealing elements for example clamping rings 313, flexures 314, flanges 315, or O-rings 323 that provide additional mechanical support to PCB 322 and reinforce the hermetic seal between atmospheric environment 310 and vacuum chamber environment 330. For example, flexures 314 may be bearings that constrain relative motion and reduce friction between moving parts in vacuum system 300. The flexure 314 may be an example of resilient member 514. Because flexures 314 have no moving parts, they provide high stiffness and high load capacity with minimal wear, thereby providing mechanical support to PCB 322 and reinforcing the hermetic seal provided by PCB 322.

Figure 6:
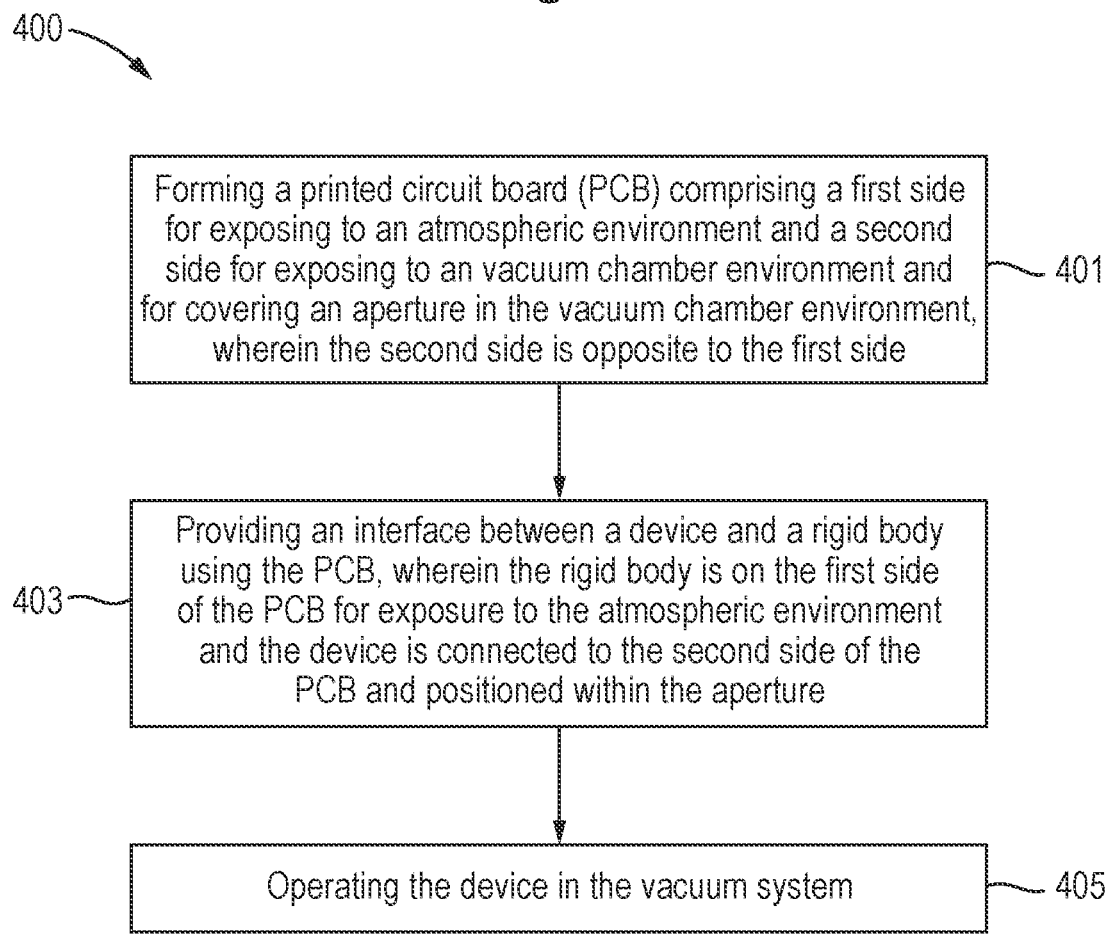
FIG. 6 is a flowchart of an exemplary process of sealing a vacuum system, consistent with embodiments of the present disclosure.

Reference is now made to FIG. 6, a flowchart illustrating an exemplary process 400 of sealing a vacuum system, consistent with embodiments of the present disclosure. A similar process might be used for detector module 500.

At step 401, a PCB (e.g., PCB 322 of FIG. 5) comprising a first side for exposing to an atmospheric environment (e.g., atmospheric environment 310 of FIG. 5) and a second side for exposing to a vacuum chamber environment (e.g., vacuum chamber environment 330 of FIG. 5) and for covering an aperture (e.g., aperture of ring 321 of FIG. 5) in the vacuum chamber environment, wherein the second side is opposite to the first side, may be formed.

At step 403, an interface between a device (e.g., device 331 of FIG. 5) and a rigid body (e.g., rigid body 311 of FIG. 5) may be provided using the PCB, wherein the rigid body is on the first side of the PCB for exposure to the atmospheric environment and the device is connected to the second side of the PCB and positioned within the aperture. The device may be a component (e.g., detection device 240 of FIG. 3) of an electron beam tool (e.g., electron beam tool 104 of FIG. 3). For example, the PCB may hermetically seal the vacuum chamber. In some embodiments, a sealing layer (e.g., sealing layer 332 of FIG. 5) may be provided between the walls of the ring and the second side of the PCB in order to reinforce the hermetic seal provided by the PCB. The sealing layer may include at least one sealing layer and may be provided on a single side of the PCB such that the sealing layer is positioned between the walls of the ring and the second side of the PCB. In some embodiments, the rigid body may provide mechanical support to the PCB such that the PCB may hermetically seal the vacuum chamber environment without any sealing layers between the walls of the ring and the PCB.

At step 405, the device may operate in the vacuum system. The hermetic seal provided by the PCB may increase the life of the device or other components of the system by preventing contaminants from entering the vacuum chamber environment from the atmospheric environment. The rigid body may be a cooling system (e.g., liquid cooling system, natural air cooling system, forced air cooling system, Peltier cooling system, etc.) that may be configured to transfer heat between the rigid body and the device. For example, PCB 322 may be configured to provide an interface between the rigid body and the device. In some embodiments, the PCB may be configured to provide a thermal connection between the rigid body and the device such that heat may transfer through the PCB between the rigid body and the device or the vacuum chamber environment during high-temperature processes or other processes where the device (e.g., opto-electric components such as position sensors, mirrors, motors, detectors, etc.) dissipates heat during inspection, thereby preventing premature failure of the device or other components due to excessive heat exposure.

The thermal conditioning system 650 may be provided in any of the above described embodiments and variations. The thermal conditioning system 650 can be used to condition at least part of the detector module 500, and more particularly, at least part of the support 501. In some embodiments, the thermal conditioning system 650 is part of the detector module 500. In some embodiments, the thermal conditioning system 650 may be operated during operation of the detector 531. As previously described, this is beneficial in controlling thermal variations and temperature in at least part of the detector module 500.

In some embodiments, the thermal conditioning system 650 comprises a support thermal conditioning section (e.g., comprising a first circuit 654 described below) configured to thermally condition the support. The thermal conditioning system 650 may comprise a further thermal conditioning section (e.g., comprising a second circuit 655 described below) configured to thermally condition another part of the detector module 500. In other words, the thermal conditioning system may comprise at least two sections which are configured to thermally condition at least primarily two different parts of the detector module 500, for example the support 501 and another part of the detector module 500.

In some embodiments, the detector module 500 is provided, for example, as shown in FIG. 7. In some embodiments, the detector module 500 comprises the conditioning module 650 which comprises two portions: a non-separable portion 675 for conditioning the feedthrough 522 and the detector 531; and a separable portion 676 for positioning or locating the electronics 670 proximate to the detector 531 and conditioning section for the electronics. The separable portion 676 is distinguished from the non-separable portion 675 by dashed line 677 in FIG. 7. The non-separable portion 675 may correspond to the support thermal conditioning section. The separable portion 676 may correspond to the further thermal conditioning section.

The separable portion 676 is configured to be removable from the detector module 500. In other words, the separable portion 676 can be removed (e.g., detached) from the detector module 500 and could be reattached to the detector module 500. The separable portion 676 can be detached and attached without damaging components of the detector module. The separable portion 676 may be connected to other parts of the detector module 500 via detachable connections. The separable portion 676 may be easily detached and attached to the rest of the detector module 500. The separable portion 676 may be detached during certain operations (e.g., maintenance operations such as bake-out).

Providing thermal conditioning system 650 with a separable portion 676 is particularly beneficial because some components of the detection module 500 (such as the electronics) may be more susceptible to damage due to thermal variation which may occur in certain stages of operation of the detector module 500 (e.g., during maintenance operations such as bake-out). For example, during bake-out, the whole detector module 500 is heated to an elevated temperature, so removal of certain components (e.g., in the separable portion) protects them from these higher temperatures.

Additionally, having a separable portion 676 provides greater design freedom for the other parts of the thermal conditioning system 650 because thermally sensitive components can be removed from the detector module 500 during parts of the operation of the detector module 500, such as during maintenance operations (e.g., during bake-out). This means that the other parts of the detector module 500 (which are removed with the separable portion) do not have to be designed to withstand the treatment conditions, such as high temperatures. Thus, the design of the other part (which is removable/separable) can be relaxed (e.g., to allow use of standard materials and processes).

The thermal conditioning system 650 may comprise at least two thermal conditioning circuits which may be arranged sequentially with respect to the flow of the conditioning fluid. Each circuit comprises components through which conditioning fluid can pass. Thus, each circuit is used to form a fluid path. For example, each circuit comprises at least one duct or conduit for the passage of the conditioning fluid. The path along which the conditioning fluid passes within the circuit is the fluid path. The conditioning circuits may be connected in series (e.g., as cascading fluid paths). The component requiring tighter thermal conditioning may be upstream of the component of lower thermal conditioning. Each thermal conditioning circuit may be provided in a different thermal conditioning section.

One of the thermal conditioning circuits may be part of the separable portion 676 (e.g., may be removable). As described in further detail below, the detector 531, which may be thermally conditioned and operating in a vacuum environment, may be positioned below the first circuit 654. Other parts of the detector module 500, such as the electronics unit 670, may be thermally conditioned by the second circuit 655. The first circuit 654 and/or the second circuit 655 may be provided as loops which are proximate and/or surrounding the component being thermally conditioned by that circuit.

The separable portion 676 may be removable due to at least one connection between the separable portion 676 and other components of the detector module 500. The separable portion 676 may comprise the further thermal conditioning section (including at least the second circuit 655) and the other part, for example the other part of the detector module 500 which is thermally conditioned by the further thermal conditioning section. Thus, the thermal conditioning system 650 may be provided in two sections wherein one of the sections can remain in position during operation of the detector module 500 and the other of the sections can be removed with the part which is thermally conditioned by the removable part of the thermal conditioning system 650.

For example, the other part may be the electronics unit 670. The electronics unit 670 is described above and is configured to be in signal communication with the detector 531 for controlling the detector 531 and/or receiving data from the detector 531. It is particularly beneficial to provide the electronics unit as at least part of the other part of the separable module which may be referred to as a conditioning module (e.g., as part of the thermal conditioning system 650 which is separable). This allows the electronics unit 670 to be placed near the detector 531 when the separable module 676 is positioned in the detector module 500, whilst allowing removal of the electronics unit 670 when conditions within the detector module 500 may negatively affect the electronics unit 670, such as during periods of high temperature (e.g., during bake-out). Furthermore, this is beneficial in that other components can be maintained in the detector module 500, for example part of the thermal conditioning system 650 so the fluid path to the feedthrough can be maintained. Additionally, this is beneficial in keeping other components of the detector module in place 500 which may reduce the likelihood of the detector being displaced relative to the incident charged particle beam path 535.

The separable portion 676 may include all external thermal conditioning connections, which may thus be removed with the separable portion 676.

The separable portion 676 is additionally beneficial in addressing issues relating to limited space being available for the detector module 500. In view of the interaction of the detector 535 with incoming charged particles (e.g., signal particles) during detection operation, heat can be generated. This is when the detector module 500 including the fluid conditioning system 650 is assembled. Heat is also generated by the electronics unit 670, yet in some embodiments the electronics unit may be located close to the detector 535 to reduce or minimize attenuation of the detector signal. Failure to address the influences of thermal load might negatively influence the positioning of the detector 535 and the performance of the electronics. Therefore, this can generally be addressed by the thermal conditioning system 650. However, the electronics may still be negatively impacted during the high thermal load applied during bake out. Thus, providing the electronics unit 670 as in the separable portion allows close proximity (and thus, space saving positioning) of the electronics unit which reduces attenuation of the signal, without subjecting the electronics unit 670 to remain in position to withstand higher thermal loads such as during bake out.

In some embodiments, the electronics unit 670 may be separable from the other components of the detector module 500. This may mean that the electronics unit 670 can be detached from the detector module 500, and specifically the thermal conditioning system 650 if relevant, and can be easily reattached as and when needed. For example, it may be beneficial to remove the electronics unit 670 during bake out to avoid the high temperatures reached during bake out from negatively affecting the electronics unit 670. The electronics unit 670 may be separable with or without other components of the detector module 500, or more specifically, with or without other components of the thermal conditioning system 650. It may be preferable to remove the electronics unit 670 without other components to simplify the removal of the electronics unit 670, which may be impacted (e.g., by the thermal variations) to a greater extent than other components.

The support thermal conditioning section may comprise a first fluid path (e.g., within the first circuit 654). The further thermal conditioning section may comprise a second fluid path (e.g., within the second circuit 655). Each thermal conditioning section may comprise at least one fluid path with at least one fluid duct forming the circuit of the fluid path.

In some embodiments, the support thermal conditioning section comprises the first circuit 654 comprising a fluid supply duct 656 and a fluid recovery duct 657. Thus, the support thermal conditioning section may provide conditioning fluid via the fluid supply duct 656 and may recover conditioning fluid via the fluid recovery duct 657. The further thermal conditioning section may comprise the second circuit 655 which may comprise duct 658. The fluid supply duct 656 and the fluid recovery duct 657 are both shown in FIG. 7, and in FIG. 9A and FIG. 9B which are cross-sections at X2 and X3 respectively as shown in FIG. 7.

Figure 9A:
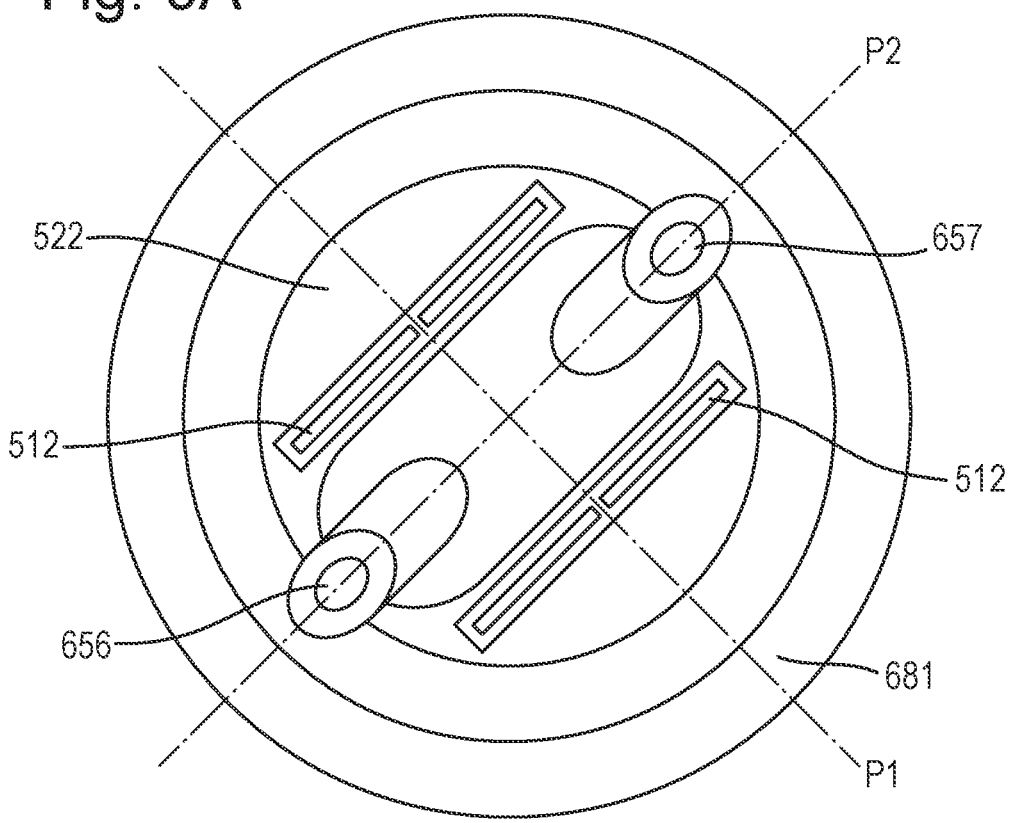
FIG. 9A and FIG. 9B are schematic diagrams illustrating cross-sections through the detector module as shown in FIG. 7, consistent with embodiments of the present disclosure.
Figure 9B:
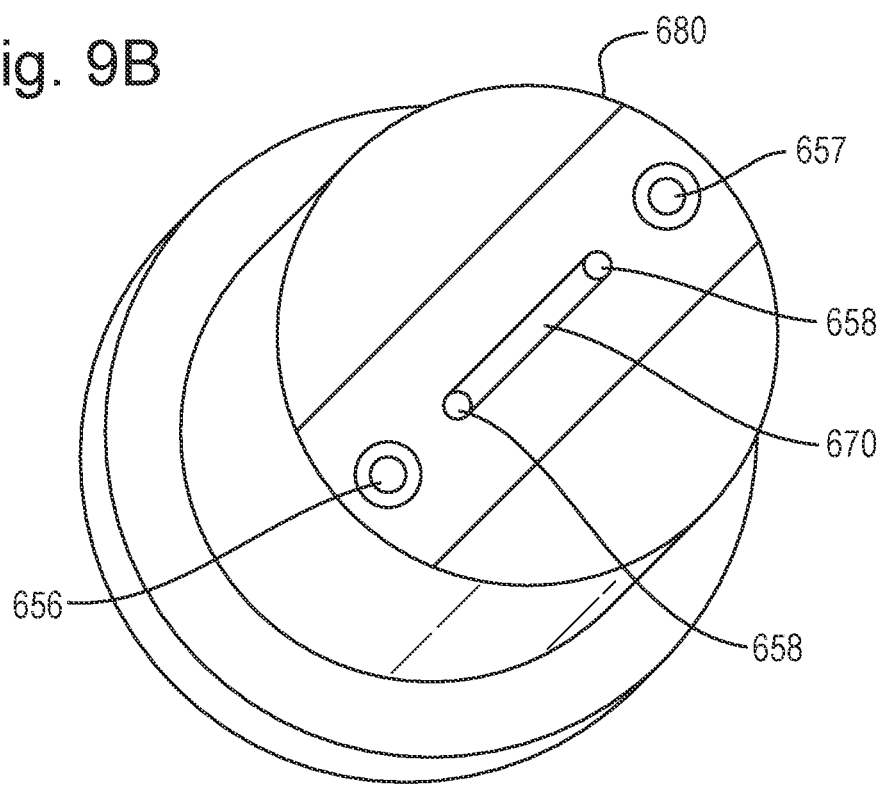

As shown in FIG. 9A, the fluid supply duct 656 and the fluid recovery duct 657 may be symmetric in a plane (represented by line P1) perpendicular to the feedthrough. The fluid supply duct 656 and the fluid recovery duct 657 may be symmetric in a further plane (represented by line P2) perpendicular to the feedthrough and the plane (P1). The electrical connections 512 may be symmetric in a plane (represented by line P1) perpendicular to the feedthrough. The electrical connections 512 may be symmetric in a further plane (represented by line P2) perpendicular to the feedthrough and the plane (P1). The fluid supply duct and fluid recovery duct may be symmetric in the same plane (or even the same planes) as the electrical connections 512, although these components may be symmetric about different planes to each other.

Each circuit may comprise a single duct. In some embodiments, at least one of the circuits may comprise multiple ducts, including two or more ducts. The ducts may otherwise be referred to as conduits, pipes, or piping. The ducts may be positioned such that the circuits are provided in a specific plane, and/or are symmetric about certain planes and/or components of the detector module 500. This is described in further detail below.

The ducts may be formed of any appropriate material. For example, the fluid supply duct 656 and/or the fluid recovery duct 657 may be flexible. This is beneficial in that it reduces forces transmitted via the flexible ducts to the support 501. In particular, the flexibility would be useful to aid damping of any vibrations generated in and transmitted from the fluid conditioning system 650 towards the detector 531. This can be beneficial in separating the force path from the thermal conditioning system 650 to reduce or prevent the components of the thermal conditioning system 650 negatively affecting the detector 531. The duct 658 forming the second fluid path may be rigid.

In some embodiments, the thermal conditioning system 650 is supported on a radially outer part of the support 501. For example, part of the thermal conditioning system 650 may be connected to a part of the support 501. In some embodiments, forces exerted by the thermal conditioning system 650 are guided to an outer part of the support, rather than the inner part of the support where the detector 531 may be mounted. For example, part of the thermal conditioning system 650 may be mounted on an outer part of the support 501 (e.g., a part of the support 501) which is in indirect (e.g., not in direct) contact with the feedthrough 522 and/or radially outwards of the ring 521. More specifically, a part of the thermal conditioning system 650, such as housing 680, may be mounted on inner mounting part 520 and/or outer mounting part 519.

In some embodiments, the thermal conditioning system 650 is supported by housing 680. The housing 680 is shown as circular in FIG. 9B, but may be any appropriate shape, e.g., hexagonal, rectilinear, elliptical etc. The housing being hexagonal may be beneficial for ease of manufacture (e.g., using sheet metal folding techniques) and/or for providing flat areas of the housing on which to mount other components. The housing 680 is configured to surround at least part of the thermal conditioning system. In some embodiments, the housing 680 supports components of the thermal conditioning system 650. In some embodiments, the housing 680 is connected to a radially outer portion of the support 501, such as the inner mounting part 520 and/or outer mounting part 519. This is beneficial in separating the force path from the thermal conditioning system 650 to reduce or prevent the components of the thermal conditioning system negatively 650 affecting the detector 531.

The thermal conditioning system 650, and in some embodiments the housing 680, may comprise a mounting flange 681 which can be used to mount the thermal conditioning system 650 to other components of the detector module 500, and in some embodiments to the support 501.

The first fluid path and the second fluid path may be in fluid communication. Thus, conditioning fluid may pass from the first fluid path to the second fluid path. In some embodiments, the conditioning fluid may pass from the second fluid path to the first fluid path. This is beneficial in that conditioning fluid used for thermal conditioning in the thermal conditioning sections (e.g., support thermal conditioning section and further thermal conditioning section) can be used in multiple thermal conditioning sections to improve efficiency and/or reduce complexity of the thermal conditioning system 650 (e.g., by using one pump (not shown) for multiple thermal conditioning sections). The first fluid path and/or the second fluid path may be referred to as sequential fluid paths, and or cascading fluid paths.

The first fluid path and the second fluid path may be in fluidic communication via a connection portion 660. The connection portion 660 may be removed to disconnect the first fluid path and the second fluid path. The connection portion 660 may be a duct. The connection portion 660 may be referred to as a loop. The connection portion 660 may be outside of the housing 680 (if provided). This may be beneficial to enable rapid assembly and disassembly.

The detector module 500 may comprise an openable and closable valve 695 between the first circuit 654 and the second circuit 655 which may be used to control fluid flow between the first flow path and the second flow path and vice-versa. For example, when the separable portion of the detector module 500 is in place, the valve 695 may be opened to allow thermal conditioning fluid to pass between the first fluid path and the second fluid path and vice-versa. When the separable portion is to be removed from the detector module 500, the valve 695 may be closed to prevent fluid passing between the first fluid path and the second fluid path. The valve 695 may thus be used to close an end of the first fluid path and/or the second fluid path. This may then prevent leakage of fluid when the separable portion is removed from the detector module 500. The valve 695 may be provided in any appropriate position to separate the first circuit 654 and the second 655.

In some embodiments, the first circuit 654 and the second circuit 655 may be provided as separate loops. In other words, the first fluid path may use first conditioning fluid and the second fluid path may use second conditioning fluid. Thus, separate circuits may be provided in which the fluid is separately controlled to thermally condition different parts of the detector module 500. This may make removal of the separable portion simpler. Additionally, this could enable continuous use of the first fluid path during a maintenance operation when the separable portion is removed.

In some embodiments, all thermal conditioning is stopped (in any of the embodiments) during maintenance operations requiring extreme conditions, such as bake-out, irrespective of whether or not any components are removed. However, thermal conditioning during a maintenance operation could be carried out (e.g., when the separable portion is removed).

Figure 10A:
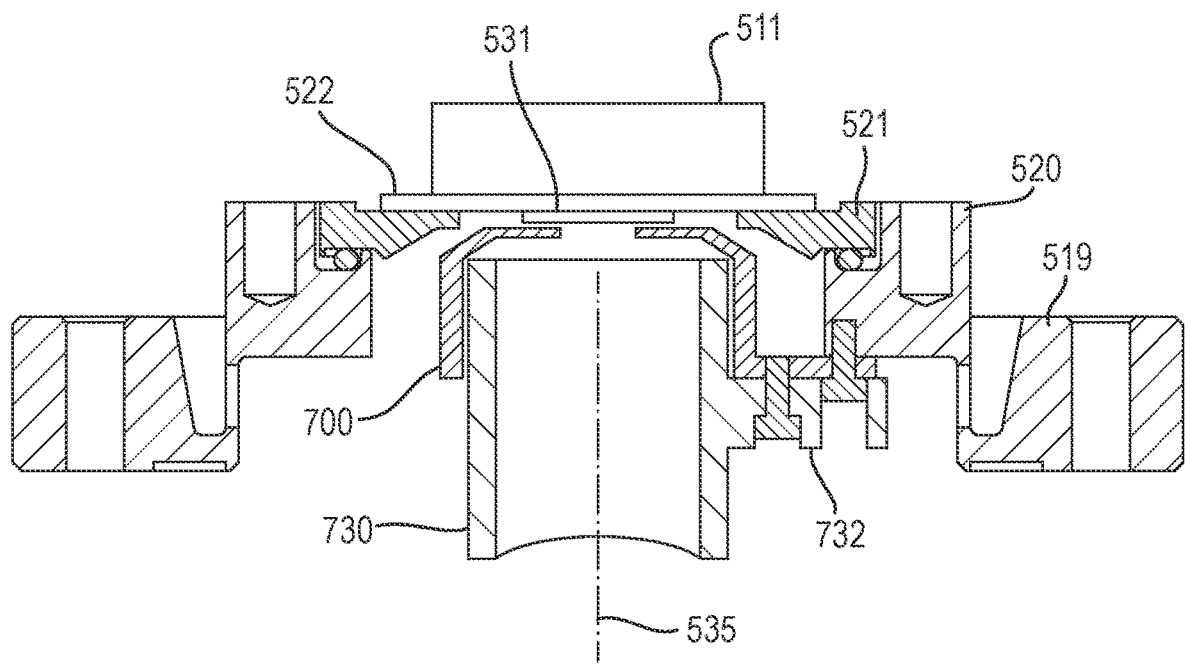
FIG. 10A is a schematic diagram illustrating a detector module, consistent with embodiments of the present disclosure.
Figure 10B:
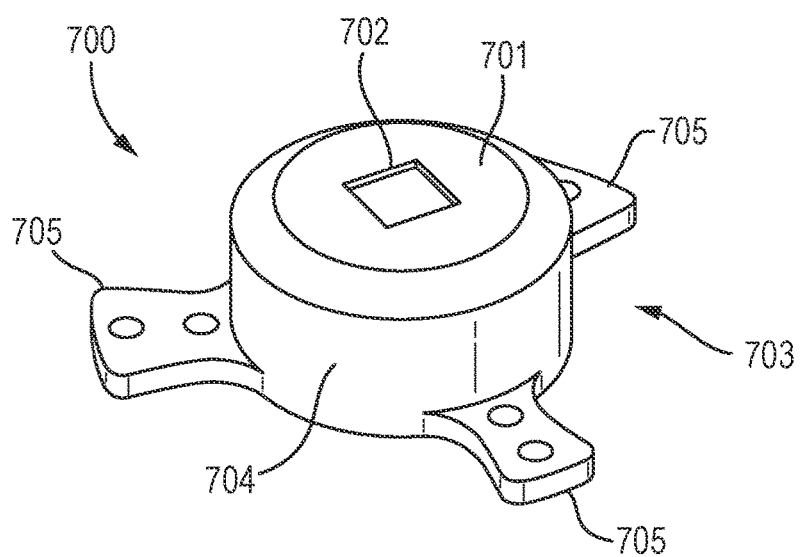
FIG. 10B, FIG. 10C, and FIG. 10D are schematic diagrams illustrating details of the detector module depicted in FIG. 10A, consistent with embodiments of the present disclosure.
Figure 10C:
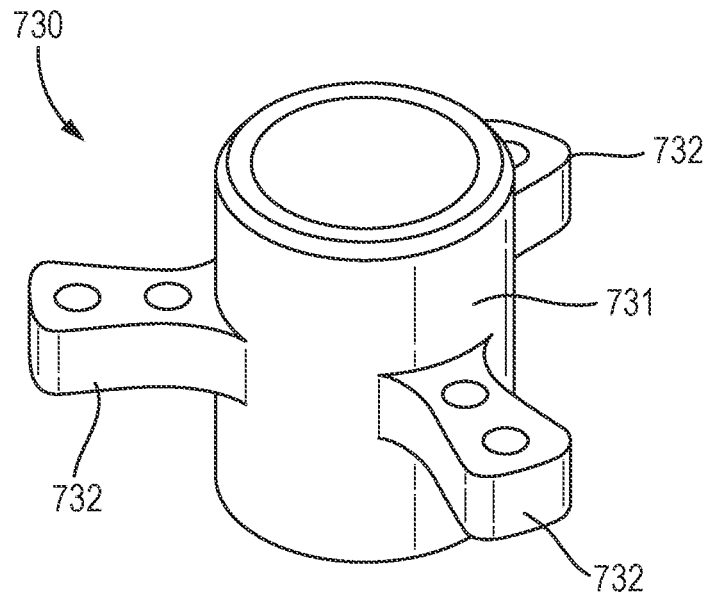
Figure 10D:
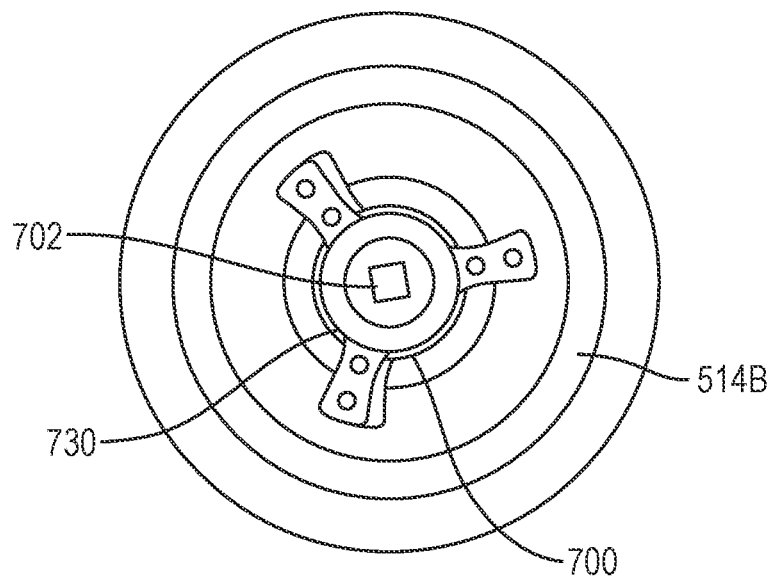

In some embodiments, the detector module 500 may comprise an electrical shield 700. An exemplary electrical shield 700 is shown in FIG. 10A, FIG. 10B, and FIG. 10D. The electrical shield 700 may be configured to shield at least part of the detector module 500 from electrical fields. The electrical shield 700 may be mounted to the support 501. In some embodiments, even with applied disturbances that deform the support 501, the part of the detector module 500 that is shielded by the electrical shield 700 is maintained. In particular, the electrical shield 700 may beneficially protect sensitive circuitry around a detection portion of the detector 531 from the electrical fields. The electrical shield 700 is beneficial for shielding parts of the detector not used for detection and other circuitry. Such circuitry can be negatively impacted by incidental electrons and charged particles, such that the electrical shield 700 can reduce or avoid such impact.

The detector 531 may comprise a detector portion configured to detect the incidental charge particle beam and another portion of the detector 531 comprising circuitry to support functionality of the detection portion which may be referred to a non-detection portion or a circuit portion. The circuitry of the circuit portion may function to processes detection signals generated by the detector on detection of a signal charged particle. The circuit portion may be around, for example surround, the detection portion. The detector portion is positioned in the path of the secondary beam so as to detect signal charged particles. The detector portion is intended to be exposed to the secondary beam. The circuitry although for supporting the detector portion and is positioned proximate, in some embodiments as close as possible to the detector portion, is sensitive to exposure of charged particles. The electrical shield 700 may be configured to shield the other portion for example the circuit portion.

The electrical shield 700 may comprise a planar portion 701. The planar portion 701 may be a flat portion of the electrical shield 700. In some embodiments, when the electrical shield 700 is in position (e.g., mounted to the support 501) the planar portion 701 of the electrical shield 700 is parallel to the feedthrough 522. This is beneficial in protecting the parts of the detector module 500 which may be negatively affected by incidental charged particles. The planar portion 701 may form the part of the electrical shield 700 which is closest to the detector 531. The planar portion 701 may be substantially orthogonal to the incidental charged particle beam path 535.

In some embodiments, an aperture 702 is defined in the planar portion 701 of the electrical shield 700 for the passage therethrough of the incidental charged particle beam path 535. The aperture 702 is shown in FIG. 10B. The aperture 702 allows charged particles from the incidental charged particle beam to reach the detector 531, whilst also restricting scattered charged particles from reaching other components of the detector module 500 such as the circuit portion. In some embodiments, the aperture 702 is a symmetric shape so as to reduce asymmetric impact on the detector 531. Thus, the shielding effect of the electrical shield is substantially symmetric on the detector 531 so as to reduce non-symmetric load on the detector which may be generated by interaction of the detector 531 with the signal charged particles. The aperture 702 may be any shape. In some embodiments, the aperture 702 is substantially circular, hexagonal, or square. The aperture 702 may be a slot. The aperture 702 may be a substantially similar shape to the detection portion of the detector 531. In some embodiments, since the detection portion may have a symmetrical shape, the shape that the non-detection portion defines in surrounding the circuit portion. Thus, the aperture may correspond to the shape of the detection portion and/or the non-detection portion. The aperture may define an area that at most corresponds to the detection portion, and may be smaller so as to ensure the shielding of the circuit portion from signal particles.

The electrical shield 700 may comprise a main body 703 comprising a cylindrical portion 704. The main body 703 may comprise the planar portion 701. The electrical shield 700 may comprise attachment 705 for connection of the main body 703 to the support 501. More specifically, the electrical shield 700 may comprise attachment 705 for connection of the cylindrical portion 704 to the support 501. There may be one attachment 705 or multiple attachments 705 (e.g., two or three or four or more). In some embodiments, the attachment 705 of the electrical shield 700 is symmetrically positioned around the cylindrical portion 704 relative to the incidental charge particle beam path 535. For example, the electrical shield 700 may have three attachments 705 which are positioned surrounding the cylindrical portion 704 and are equidistant from each other. However, there could be only one or two attachments, or there could be more than three attachments. Due to the positioning of the attachments, the attachments 705 and/or the electrical shield 700 may be symmetric (e.g., rotationally symmetric) relative to the incidental charge particle beam path 705.

In any of the above embodiments, the detector module 500 may comprise magnetic shield 730. An exemplary magnetic shield 730 is shown in FIG. 10A, FIG. 10C, and FIG. 10D. The magnetic shield 730 may be configured to shield at least part of the detector module 500 from magnetic fields. The magnetic shield 730 may be mounted to the support 501. In some embodiments, even with applied disturbances that deform the support 501, the part of the support 501 that is shielded by the magnetic shield 730 is maintained. In some embodiments, the magnetic shield 730 is positioned as close as possible to the detector 531 to maximize the shielding provided so that the trajectory of the incidental charged particle beam is influenced as little as possible by external magnetic fields.

The magnetic shield 730 may comprise a cylindrical main body 731. In some embodiments, when the magnetic shield 730 is positioned in the detector module 500, the cylindrical main body 731 has an axis which is substantially parallel to the incidental charge particle beam path 535.

The magnetic shield 730 may be any appropriate material. In some embodiments, the magnetic shield may be HyMu 80® or comparable material.

The magnetic shield 730 may comprise attachment 732 for connection of the magnetic shield 730 to the support 501. More specifically, the magnetic shield 730 may comprise attachment 732 for connection of the cylindrical main body 731 to the support 501. Due to the positioning of the attachment 732, the attachment 732 and/or the magnetic shield 730 may be symmetric (e.g., rotationally symmetric) relative to the incidental charge particle beam path 705. In some embodiments the attachment 732 connects the magnetic shield 730 to the electrical shield 700, which is in turn mounted to the support 501. In other words, the connection of the magnetic shield 730 to the support 501 may be via the electrical shield 700, or in another arrangement the electrical shield 700 may be via the magnetic shield 730. Both of these arrangements are examples of the magnetic shield and the electrical shield being connected to the support at the same location or locations.

For example, the magnetic shield 730 may have three attachments 732. The three attachments 732 may be positioned surrounding the cylindrical main body 731, wherein the attachments 732 may be equidistant from each other. However, there could be only one attachment.

The attachment 732 may be provided as a single attachment surrounding the cylindrical main body 731. In some embodiments, the magnetic shield 730 may comprise multiple attachments (e.g., two or three or four or more attachments). In some embodiments, the multiple attachments 732 are symmetrically positioned around the cylindrical main body 731 relative to the incidental charge particle beam path 535.

In some embodiments, the magnetic shield 730 is rotational symmetrical relative to the incidental charge particle beam path 535. In other words, the magnetic shield can be rotated about the incidental charge particle beam path 535 and when rotated a certain amount, the magnetic shield 730 is the same. This is shown in FIG. 10C in which the attachments are formed as three attachments which are equidistant from each other around the outside of a cylindrical body 731.

In some embodiments the electrical shield 700 and/or the magnetic shield 730 are connected to an outer portion of the support 501. In some embodiments, the electrical shield 700 and/or the magnetic shield 730 are connected to an outer part of the support 501, rather than the inner part of the support 501 where the device 331/detector 531 may be mounted. For example, the electrical shield 700 and/or the magnetic shield 730 may be mounted on an outer part of the support 501, for example a part of the support 501 which is not in direct contact (e.g., in indirect contact) with the feedthrough 522/ radially outwards of the ring 521. More specifically, the electrical shield 700 and/or the magnetic shield 730 may be mounted on inner mounting part 520 and/or outer mounting part 519. The electrical shield 700 and/or the magnetic shield 730 may be connected to the support at a component which is radially inwards of the resilient member 514 if it is provided (e.g., to the inner mounting part 520). This is beneficial in reducing the effect of deformation of the support 501 on the position of the electrical shield 700 and/or the magnetic shield 730.

Overall, the electrical shield and/or the magnetic shield are useful to avoid variation in the incidental charged particle beam path 535 and to protect parts of the detector module 500 to assist in maintaining the position of the detector 531 relative to the incidental charged particle beam path 535. So that for example the shielding of the circuit portion of the detector is maintained whilst the support deforms to maintain the position of the detector relative to the secondary beam. The electrical shield 700 and/or the magnetic shield 730 may effectively create a conduit for charged particles to target the detector 531.

In the various embodiments and examples described above, specific positions of parts of the detector module 500 are described. As described herein, certain components of the detector module 500 may be positioned to be symmetrical in at least one plane and/or around an axis.

There may be symmetry in at least one, or several, individual aspects of the design, including mechanical design, electrical connectivity, and/or the conditioning system. The symmetry may be a rotational symmetry. The symmetry may be a mirror symmetry (e.g., symmetry in a plane). For example, there may be symmetry in a plane comprising the incidental charged particle beam path 535, and the plane may be orthogonal to a plane coplanar with the detector. For example, there may be symmetry in a plane orthogonal to the incidental charged particle beam path 535 (e.g., there may be symmetry in a plane parallel to plane 536).

As described above, applied disturbances may affect the position of the detector 531 in a plane of the detector 531 (which may be parallel to plane 536 in FIG. 4A), or along the incidental charged particle beam path 535 (which may be orthogonal to the plane of the detector 531). The applied disturbances could affect the rotation of the detector 531 about the incidental charged particle beam path 535 and/or tilt (or angle) of the detector 531 out of the ideal detector plane (e.g., orthogonal to the beam path 535 or the initial calibrated position of the beam path). Thus, the symmetry of at least one component may be beneficial in reducing or preventing deformation of the support 501 which may result in such movement of the detector 531 (e.g., linear movement, rotation, tilt, etc.).

In some embodiments, the detector 531 is designed at an assumed thermal center, that matches with charged particle beam path 535. Thus, the resilient member 514 may be designed such that it is compliant in a radial inwards/ outwards direction with respect to the thermal center. All other degrees of freedom may be constrained by design, including tilt and rotation. This means that when an (asymmetric) external force is applied on components such as the feedthrough 522, ring 521, inner mounting support 520, etc. the resulting displacement is also restricted.

As previously described, it is beneficial to maintain the position of the detector 531 relative to the incidental charge particle beam path 535. As also described, applied disturbances during operation deform the support 501. Generally, the detector module 500 can be configured such that disturbances of the support 501 are symmetric relative to the incidental charge particle beam path 535. This may be put into effect in a number of different ways. For example, the use of the resilient member 514 described above, the positioning of the detector 531, the use of the thermal conditioning system 560, the feedthrough 522, the configuration of the support 501, and/or the electronics unit 690, which may be positioned such that disturbances of the support are symmetrical relative to the incidental charge particle beam path 535. In other words, the deformation of the support 501 may be symmetrical relative to the incidental charge particle beam path 535. This means that the position of the detector 531 can be maintained relative to the incidental charge particle beam path 535.

Additionally, it is noted that there are generally volume restrictions in tools and apparatus in which such detector modules 500 may be used. Symmetrical design can improve or maximize integration density in view of such a limited space. This may address disadvantages of volume restrictions which often limit design options. Providing symmetry in aspects of the detector module 500 as described is beneficial in balancing accurate positioning, efficient thermal conditioning and optimized electrical connectivity towards a detector 531.

The detector 531 may be positioned in a central region of the feedthrough 522. The detector 531 and/or feedthrough 522 may have mirror symmetry (e.g., symmetry in a plane). The detector 531 may be positioned on the feedthrough 522 such that the detector 531 and feedthrough 522 are symmetrical in at least one plane comprising the incidental charged particle beam path 535. The detector 531 and/or feedthrough 522 may be positioned substantially symmetrically in a plane comprising the incidental charged particle beam path 535, the plane being perpendicular to the feedthrough 522.

Components connected to or part of the feedthrough 522 may have mirror symmetry. For example, electrical connections 512 may be symmetrical in a plane (represented by line P1 in FIG. 9A) perpendicular to the feedthrough 522. The electrical connections 512 may be symmetrical in a further plane (represented by line P2) perpendicular to the feedthrough and the plane (P1).

As described above, certain embodiments may comprise the resilient member 514, which may be the first type resilient member 514A and/or the second type resilient member 514B. The resilient member 514 may be symmetric (e.g., rotationally symmetric) relative to the incidental charge particle beam path 535. The resilient member 514 may be substantially symmetric in a plane, the plane comprising the incidental charge particle beam path 535 and being perpendicular to the feedthrough 522. The resilient member 514 may be symmetric in a plane parallel to the feedthrough 522. The resilient member 514 may be configured so that during operation of the detector 531, deformation of the support 501 is symmetric relative to the incidental charge particle beam path 535.

As described above, the detector module 500 may comprise a rigid body 511. The rigid body may be configured so that during operation of the detector 531, deformation of the support 501 is symmetric relative to the incidental charge particle beam path 535. The rigid body 511 may be positioned such that it is symmetric relative to the incidental charge particle beam path 535 (e.g., rotationally symmetric). The rigid body 511 may be configured such that it is symmetric in a plane parallel to the feedthrough 522. The rigid body 511 may be symmetric in a plane comprising the incidental charge particle beam path 535, the plane being perpendicular to the feedthrough 522.

As described above, the rigid body may be at least part of the thermal conditioning system 650. As the thermal conditioning system 650 may comprise the rigid body 511, at least parts of the thermal conditioning system 650 may be positioned symmetrically. As described in relation to the rigid body 511, the thermal conditioning system 650 may be configured so that during operation of the detector 531, deformation of the support 501 (e.g., due to thermal variation) is symmetric relative to the incidental charged particle beam path 535.

Specific components of the thermal conditioning system 650 may be positioned symmetrically (e.g., as shown in FIG. 8A, FIG. 8B, and FIG. 9A). As described above, the thermal conditioning system may generate and propagate vibrations along the fluid conditioning path. The conditioning fluid may be an incompressible fluid (e.g., water) which is more likely to propagate vibrations. Providing components of the thermal conditioning system 650 in symmetrical positions should mean that any distortions induced by the thermal conditioning system 650 would be applied more symmetrically around the support than otherwise.

The supply connection 651 and the recovery connection 652 may be positioned in a central region of the feedthrough 522. The supply connection 651 may be a single connection or multiple connections (e.g., two, or three, or four or more connections). The recover connection 652 may be a single connection or multiple connections (e.g., two, or three, or four or more connections). The supply connection 651 and the recovery connection 652 may be positioned symmetrically relative to the support 501. For example, at least the one supply connection 561 and the recovery connection 562 may be positioned such that they are opposite each other relative to a plane comprising the incidental charge particle beam path 535, the plane being perpendicular to the feedthrough 522. The supply connection 561 and the recovery connection 562 may be rotationally symmetric about the incidental charged particle beam path 535.

As described above, channel 653 may be provided which may be at least partially defined by the thermal conditioning system 650. The channel 653 may be positioned in a central region of the feedthrough 522. The channel 653 may be provided in a region of the feedthrough 522 opposite the detector 531 mounted on the other side of the feedthrough 522.

The shape of the channel 653 may be substantially symmetric relative to the incidental charge particle beam path 535. Specifically, the shape of the channel may be substantially rotationally symmetric relative to the incidental charge particle beam path 535, for example, as shown in FIG. 8A. In other words, it may be possible to rotate the channel about the incidental charge particle beam path 535 and the channel 535 will look the same at least twice in a 360 degree rotation. The shape of the channel 653 may be substantially symmetric relative to a plane, for example, a plane comprising the incidental charge particle beam path 535 and being perpendicular to the feedthrough 522, for example, as shown in FIG. 8B. The plane of symmetry may be substantially through the middle of the detector 531 and/or the feedthrough 522 and/or the support 501.

The channel 653 may have a curving path, which may otherwise be referred to as a tortuous and/or convoluted path (e.g., route). In some embodiments, the channel comprises at least a portion which is sinusoidal. In some embodiments, the path is formed in an s-shape, as shown in FIG. 8A.

As shown in FIG. 9A, the fluid supply duct 656 and the fluid recovery duct 657 may be symmetrical in a plane (represented by line P1) perpendicular to the feedthrough. The fluid supply duct 656 and the fluid recovery duct 657 may be symmetrical in a further plane (represented by line P2) perpendicular to the feedthrough and the plane (P1). The fluid supply duct and fluid recovery duct may be symmetrical in the same plane (or even the same planes) as electrical connections 512 on the feedthrough 522, although these components may be symmetrical about different planes to each other.

As described above, the detector module 500 may comprise the electronics unit 670. Electrical connections of the electronic unit 670 may be positioned symmetrically relative to the incidental charge particle beam path 535. The electronics 670 unit may be positioned symmetrically relative to a plane. For example, the plane comprising the incidental charge particle beam path 535 and being perpendicular to the feedthrough 522. The plane of symmetry may be substantially through the middle of the detector 531 and/or the feedthrough 522 and/or the support 501. The electrical connections of the electronics unit 670 may be symmetrically positioned. The electrical connections on the support 501 may also be symmetrically positioned.

As described above, the thermal conditioning system 670 may comprise a first fluid path (which may otherwise be referred to as a first circuit) and a second fluid path (which may otherwise be referred to as a second circuit). The first fluid path and the second fluid path may be provided substantially within a plane. For example, a plane comprising the incidental charge particle beam path 535 and being perpendicular to the feedthrough 522. The plane may be substantially through the middle of the detector 531 and/or the feedthrough 522 and/or the support 501. The electronics unit 670 may be provided in substantially the same plane. The electronics unit 670 may be provided within the second fluid path in the plane. For example, in a cross section through the plane, the electronics unit 670 may be at least partially surrounded by the second fluid path.

At least part of the first flow path may be symmetrical in a plane. For example, the plane comprising the incidental charge particle beam path 535 and being perpendicular to the feedthrough 522. At least part of the second flow path may be substantially symmetrical in the plane. For example, the plane comprising the incidental charge particle beam path 535 and being perpendicular to the feedthrough 522. The first flow path and the second flow path may be symmetrical in the same plane.

As described above, the detector 531 and/or feedthrough 522 and/or support 501 may be positioned within the detector module 500 such that the detector 531 and/or feedthrough 522 and/or support 501 are symmetric relative to the incidental charge particle beam path 525. The detector 531 and/or feedthrough 522 and/or support 501 may be rotationally symmetric about the incidental charge particle beam path 535. The detector 531 and/or feedthrough 522 and/or support 501 may have reflective symmetry (e.g., mirror symmetry) in a plane, for example, the plane comprising the incidental charge particle beam path 535 and being perpendicular to the feedthrough 522. The plane may be substantially through the middle of the detector 531 and/or the feedthrough 522 and/or the support 501.

The feedthrough 522 as described in any of the above embodiments or examples comprises electrical connection 512 on the surface of the feedthrough 522. There may be one electrical connection or a plurality of electrical connections (e.g., two, or three, of four or more). A shape of the electrical connection 512 may be symmetric. For example, the electrical connection 512 may be symmetric in a plane. For example, in the plane comprising the incidental charge particle beam path 535 and being perpendicular to the feedthrough 522. For example, the electrical connection may have mirror symmetry about a plane through the middle of the feedthrough 522, as shown in FIG. 8A and FIG. 8B. In some embodiments, the electrical connection 512 may be rotationally symmetric, for example, about the incidental charged particle beam path 535, which is also shown in FIG. 8A and FIG. 8B.

Any of the above embodiments or examples may comprise electrical shield 700 and/or magnetic shield 730. The electrical shield 700 and/or magnetic shield 730 may be provided in a shape which is symmetric relative to the incidental charge particle beam path 535. For example, the electrical shield 700 and/or magnetic shield 730 may be rotationally symmetric relative to the incidental charged particle beam path 535. The electrical shield 700 and/or magnetic shield 730 may be symmetric in a plane (e.g., having mirror symmetry) the plane comprising the incidental charge particle beam path 535. The electrical shield 700 and/or magnetic shield 730 may be symmetric in a plane orthogonal to the incidental charge particle beam path 535 (e.g., parallel to plane 536 shown in FIG. 4A). The electrical shield 700 and/or the magnetic shield 730 may be symmetrical in the same way for example about the same axis (such as the incidental charged particle beam path 535) and/or the same plane (e.g., the plane comprising the incidental charged particle beam path 535 and being orthogonal to the path).

In any of the above embodiments, the detector module 500 may be configured to reduce or minimize a thermal resistance between components. This can be done by selecting materials to reduce variation in the coefficient of thermal expansion. At least two components of the detector module 500 may include a material or materials that reduces or minimizes thermal resistance between the components. For example, the material may be the same, or materials may be used having a coefficient of thermal expansion (CTE) which is substantially similar, for different components.

For example, the feedthrough 522 may include a material that may reduce or minimize a thermal resistance between the detector 531 (or device 331) and the feedthrough 522. For example, feedthrough 522 may include a material (e.g., insulators, ceramics, alumina, SiN, etc.) having a CTE that is substantially similar to the CTE of detector 531 (or device 331) (e.g., the CTE of feedthrough 522 may be similar to or the same as the CTE of the detector 531 (or device 331)). Matching the CTE, or choosing materials having similar CTEs for the feedthrough 522 and the detector 531 may be particularly beneficial in that it can reduce or minimize stress and strain in the detector 521 and/or feedthrough 522 which might otherwise damage the detector 531. This is advantageous in maintaining the quality of the inspection system after high temperature processes (e.g., baking cycles). Of course, other components of the detector module 500 may also have substantially similar coefficients of thermal expansion.

More generally, reducing or minimizing mismatches in CTE is beneficial in reducing or minimizing the impact of disturbances (e.g., due to thermal load generated in normal use, and/or because of failure of thermal conditioning system, and/or due to bake-out procedures, etc.). This can make it easier to generate the vacuum in the vacuum chamber. Failure to address the thermal distortion can lead to inaccurate positioning and so matching the coefficient of components of the detector module 500 can be beneficial in maintaining the position of the detector 531 relative to the incidental charged particle beam path 535. In some embodiments, the PCB may include a material that may reduce or minimize a thermal resistance between the device and the PCB. For example, the PCB may include a material (e.g., insulators, ceramics, alumina, SiN, etc.) having a CTE that is substantially similar to the CTE of the device (e.g., the CTE of PCB 322 may be similar to or the same as the CTE of device 331), advantageously reducing strain on the PCB and the device, thereby maintaining the quality of the inspection system after high temperature process (e.g., baking cycles).

For different applications, the feedthrough 522 (for example the PCB), may have different shapes when viewed in the y-direction (e.g., round, hexagonal, rectangular, etc.) in order to strengthen the interface between the atmospheric environment and the vacuum chamber environment.

In some embodiments, a method of detecting an incidental charged particle beam (e.g., in a charged particle beam inspection tool) is provided. The method comprises providing a detector module, which may be the detector module 500 described in any of the above mentioned embodiments/variations. The detector module 500 comprises detector 531 configured to be alignable with an incidental charged particle beam path 535. The detector module 500 also comprises support 501 for defining at least a part of the wall of the vacuum chamber. The support 501 may comprise feedthrough 522 to which the detector 531 is mounted, wherein the detector 531 is electrically connected through the feedthrough 522. As described above, applied disturbances may deform the support 501. The detector module 500 is configured so that, with disturbances to the detector 531 and/or support 501, the position of the detector 531 during operation of the detector 531 is maintained relative to the incidental charged particle beam path 535. The method further comprises providing a vacuum environment around the detector 535 and providing an incidental charged particle beam for detection by the detector 531.

In some embodiments, a method of detecting an incidental charged particle beam in a charged particle beam inspection tool is provided. The method comprises operating a detector 531, for example as described in any of the above embodiments. The method comprises maintaining the position of the detector 531 relative to an incidental charged particle beam path 535 on application of disturbances to the detector 531 and/or support 501.

The detector module 500 may comprise a resilient member 514 (e.g., as described in any of the above embodiments) surrounding the feedthrough 522. The resilient member 514 may be configured to move in a direction radially inwards and outwards in a plane perpendicular to the incidental charged particle beam path 535.

The detector module 500 may comprise thermal conditioning system 650. The method may comprise transferring heat from the support 501. As the heat is transferred from the support 501, the method further comprises transferring heat from the detector 531.

As described above, the detector 531 and/or feedthrough 522 and/or support 501 may be positioned within the detector module 500 such that it is symmetric relative to the incidental charged particle beam path 535 and/or a plane parallel to the detector 531 and/or feedthrough 522. The detector 531 and/or feedthrough 522 and/or support 501 may be symmetrical as described in any of the variations above.

In some embodiments, a method of detecting an incidental charged particle beam (e.g., in a charged particle beam inspection tool) is provided. The method comprises providing a detector module, which may be the detector module 500 described in any of the above mentioned embodiments/variations. The detector module 500 comprises a detector 531 configured to operate in a vacuum chamber. The detector 531 may be configured to be alignable with an incidental charged particle beam path 535. The detector module 500 may comprise support 501 for defining at least a part of the wall of the vacuum chamber, the support 501 comprising a feedthrough 522 to which the detector 531 is mounted. The detector may be electrically connected through the feedthrough 522. The detector module 500 may comprise thermal conditioning system 650 comprising a support thermal conditioning section configured to thermally condition the support 501 and a further thermal conditioning section configured to thermally condition another part of the detector module 500. The detector module 500 also comprises a separable portion comprising the other part of the detector module 500 and the further thermal conditioning section, wherein the separable portion is configured to be removable from the detector module 500. The method may further comprise providing fluid to the support thermal conditioning section and the further thermal conditioning section, providing the vacuum environment around the detector 531, and/or providing an incidental charged particle beam for detection by the detector 531.

In some embodiments, a method of removing the separable portion from the detector module can be provided. The detector module 500 may comprise thermal conditioning system 650 which may comprise a separable portion as described above. The method may comprise separating the further thermal conditioning section from the support thermal conditioning section, and removing the other part from the detector module 500.

In some embodiments, a method of detecting an incidental charged particle beam (e.g., in a charged particle beam inspection tool) is provided. The method may comprise providing a detector module, which may be the detector module 500 described in any of the above mentioned embodiments/variations. The detector module 500 may comprise detector 531 configured to operate in a vacuum chamber. The detector 531 may be configured to be alignable with an incidental charged particle beam path 535. The detector module 500 may comprise support 501 for defining at least a part of the wall of the vacuum chamber, the support 501 may comprise feedthrough 522 to which the detector 531 can be mounted. The detector 531 may be electrically connected through the feedthrough 522. The detector module 500 may also comprise an electrical shield 700 configured to shield at least part of the support 501 from electrical fields, wherein the electrical shield 700 is mounted to the support 501 such that during operation with applied disturbances that deform the support 501, the part of the detector module 500 that is shielded by the electrical shield 700 is maintained. The method may further comprise providing the vacuum environment around the detector 531, and providing an incidental charged particle beam for detection by the detector 531. The method may comprise maintaining the shielding of the part of the detector module 500 by the electrical shield during operation.

In some embodiments, a method of detecting an incidental charged particle beam using the detector module as described in any of the above embodiments/variations is provided.

An assessment tool according to embodiments of the present disclosure may be a tool which makes a qualitative assessment of a sample (e.g., pass/fail), one which makes a quantitative measurement (e.g., the size of a feature) of a sample or one which generates an image of map of a sample. Examples of assessment tools are inspection tools (e.g., for identifying defects), review tools (e.g., for classifying defects) and metrology tools, or tools capable of performing any combination of assessment functionalities associated with inspection tools, review tools, or metrology tools (e.g., metro-inspection tools). The electron-optical column 40 may be a component of an assessment tool; such as an inspection tool or a metro-inspection tool, or part of an e-beam lithography tool. Any reference to a tool herein is intended to encompass a device, apparatus or system, the tool comprising various components which may or may not be collocated, and which may even be located in separate rooms, especially for example for data processing elements.

Reference to a component or system of components or elements being controllable to manipulate a charged particle beam in a certain manner includes configuring a controller or control system or control unit to control the component to manipulate the charged particle beam in the manner described, as well as optionally using other controllers or devices (e.g., voltage supplies and/or current supplies) to control the component to manipulate the charged particle beam in this manner. For example, a voltage supply may be electrically connected to one or more components to apply potentials to the components, such as in a non-limited list including a control lens array, the objective lens array 241, the condenser lens 210, correctors, a collimator element array, and a scan deflector array, under the control of the controller or control system or control unit. An actuatable component, such as a stage, may be controllable to actuate and thus move relative to other components such as the beam path using one or more controllers, control systems, or control units to control the actuation of the component.

References to upper and lower, up and down, above and below should be understood as referring to directions parallel to the (typically but not always vertical) up-beam and down-beam directions of the electron beam or multi-beam impinging on the sample. Thus, references to up beam and down beam are intended to refer to directions in respect of the beam path independently of any present gravitational field. Up-beam being towards the source and down-beam being towards the sample.

It will be appreciated that the embodiments of the present disclosure are not limited to the exact construction that has been described above and illustrated in the accompanying drawings, and that various modifications and changes may be made without departing from the scope thereof.

The following clauses define preferable combinations of features. The applicant reserves the right to pursue protection for these combinations of features, and/or any other subject-matter contained in the application as filed. These clauses are not the claims of the current application which are contained in a separate section headed "claims".

Clause 1: A system for sealing a vacuum system configured to provide an atmospheric environment and a vacuum chamber environment, the system comprising: a printed circuit board (PCB) comprising: a first side for exposing to the atmospheric environment, and a second side for exposing to the vacuum chamber environment and for covering an aperture in the vacuum chamber environment, wherein the second side is opposite to the first side; a rigid body on the first side of the PCB; a device connected to the second side of the PCB and positioned on a portion of the PCB that covers the aperture; and wherein the PCB is configured to provide an interface between the device and the rigid body.

Clause 2: The system of clause 1, wherein the PCB comprises SiN.

Clause 3: The system of clause 1, wherein the PCB comprises alumina.

Clause 4: The system of any one of clauses 1-3, wherein the PCB comprises a plurality of layers.

Clause 5: The system of clause 4, wherein each layer comprises at least one of a via or a trace.

Clause 6: The system of clause 5, wherein the via comprises a plurality of vias.

Clause 7: The system of any one of clauses 5-6, wherein the via does not extend through an entire length of the PCB.

Clause 8: The system of any one of clauses 5-7, wherein the trace comprises a plurality of traces.

Clause 9: The system of any one of clauses 5-8, wherein the trace is configured to route high speed signals.

Clause 10: The system of any one of clauses 1-9, wherein the PCB comprises a material configured to reduce a thermal resistance between the device and the PCB.

Clause 11: The system of any one of clauses 1-10, wherein the PCB comprises a material having a coefficient of thermal expansion that is substantially similar to a coefficient of thermal expansion of the device.

Clause 12: The system of any one of clauses 1-11, wherein the interface is configured to provide a thermal connection between the rigid body and the device.

Clause 13: The system of any one of clauses 1-12, wherein the rigid body is further configured to extend over material forming the aperture.

Clause 14: The system of any one of clauses 1-13, wherein the rigid body is further configured to provide mechanical support to the PCB.

Clause 15: The system of any one of clauses 1-14, wherein the PCB provides a hermetic seal to the vacuum chamber environment.

Clause 16: The system of clause 15, wherein the rigid body is further configured to reinforce the hermetic seal provided by the PCB.

Clause 17: The system of any one of clauses 1-16, wherein the rigid body comprises a plurality of rigid bodies.

Clause 18: The system of any one of clauses 1-17, wherein the rigid body comprises a cooling system.

Clause 19: The system of any one of clauses 1-18, further comprising a flexure for exposure in the vacuum chamber environment.

Clause 20: The system of clause 19, wherein the flexure comprises a plurality of flexures.

Clause 21: The system of any one of clauses 19-20, wherein the flexure is configured to provide mechanical support to the PCB.

Clause 22: The system of any one of clauses 19-21, wherein the flexure is configured to reinforce the hermetic seal provided by the PCB.

Clause 23: The system of any one of clauses 1-22, further comprising material that forms the aperture, wherein the material surrounds the aperture and comprises a round shape.

Clause 24: The system of any one of clauses 1-23, wherein the device is directly connected to the second side of the PCB.

Clause 25: The system of any one of clauses 1-24, wherein the device comprises a plurality of devices.

Clause 26: The system of any one of clauses 1-25, wherein the device comprises a detector.

Clause 27: The system of any one of clauses 1-26, wherein the device is configured to operate in the vacuum chamber environment.

Clause 28: The system of any one of clauses 1-27, further comprising: material that forms the aperture, wherein the material surrounds the aperture; and wherein the PCB further comprises a sealing layer on a single side of the PCB, the sealing layer positioned between the material and the second side of the PCB.

Clause 29: The system of clause 28, wherein the sealing layer comprises a plurality of sealing layers.

Clause 30: The system of any one of clauses 28-29, wherein the sealing layer comprises solder.

Clause 31: The system of any one of clauses 1-30, wherein the system comprises an extreme ultraviolet inspection system.

Clause 32: The system of any one of clauses 1-30, wherein the system comprises a deep ultraviolet inspection system.

Clause 33: The system of any one of clauses 1-32, wherein covering the aperture comprises filling the aperture.

Clause 34: A method for sealing a vacuum system configured to provide an atmospheric environment and a vacuum chamber environment, comprising: providing an interface between a device and a rigid body using a printed circuit board (PCB), the PCB comprising: a first side for exposing to the atmospheric environment, and a second side for exposing to the vacuum chamber environment and for covering an aperture in the vacuum chamber environment, wherein the second side is opposite to the first side; wherein the rigid body is on the first side of the PCB and the device is connected to the second side of the PCB and positioned on a portion of the PCB that covers the aperture; and operating the device in the vacuum system.

Clause 35: The method of clause 34, wherein the PCB comprises SiN.

Clause 36: The method of clause 34, wherein the PCB comprises alumina.

Clause 37: The method of any one of clauses 34-36, wherein the PCB comprises a plurality of layers.

Clause 38: The method of clause 37, wherein each layer comprises at least one of a via or a trace.

Clause 39: The method of clause 38, wherein the via comprises a plurality of vias.

Clause 40: The method of any one of clauses 38-39, wherein the via does not extend through an entire length of the PCB.

Clause 41: The method of any one of clauses 38-40, wherein the trace comprises a plurality of traces.

Clause 42: The method of any one of clauses 38-41, wherein the trace is configured to route high speed signals.

Clause 43: The method of any one of clauses 34-42, wherein the PCB comprises a material configured to reduce a thermal resistance between the device and the PCB.

Clause 44: The method of any one of clauses 34-43, wherein the PCB comprises a material having a coefficient of thermal expansion that is substantially similar to a coefficient of thermal expansion of the device.

Clause 45: The method of any one of clauses 34-44, wherein the interface is configured to provide a thermal connection between the rigid body and the device.

Clause 46: The method of any one of clauses 34-45, wherein the rigid body is further configured to extend over material forming the aperture.

Clause 47: The method of any one of clauses 34-46, wherein the rigid body is further configured to provide mechanical support to the PCB.

Clause 48: The method of any one of clauses 34-47, wherein the PCB provides a hermetic seal to the vacuum chamber environment.

Clause 49: The method of clause 48, wherein the rigid body is further configured to reinforce the hermetic seal provided by the PCB.

Clause 50: The method of any one of clauses 34-49, wherein the rigid body comprises a plurality of rigid bodies.

Clause 51: The method of any one of clauses 34-50, wherein the rigid body comprises a cooling system.

Clause 52: The method of any one of clauses 34-51, further comprising a flexure for exposure in the vacuum chamber environment.

Clause 53: The method of clause 52, wherein the flexure comprises a plurality of flexures.

Clause 54: The method of any one of clauses 52-53, wherein the flexure is configured to provide mechanical support to the PCB.

Clause 55: The method of any one of clauses 53-54, wherein the flexure is configured to reinforce the hermetic seal provided by the PCB.

Clause 56: The method of any one of clauses 34-55, further comprising material that forms the aperture, wherein the material surrounds the aperture and comprises a round shape.

Clause 57: The method of any one of clauses 34-56, wherein the device is directly connected to the second side of the PCB.

Clause 58: The method of any one of clauses 34-57, wherein the device comprises a plurality of devices.

Clause 59: The method of any one of clauses 34-58, wherein the device comprises a detector.

Clause 60: The method of any one of clauses 34-59, further comprising: material that forms the aperture, wherein the material surrounds the aperture; and wherein the PCB further comprises a sealing layer on a single side of the PCB, the sealing layer positioned between the material and the second side of the PCB.

Clause 61: The method of clause 60, wherein the sealing layer comprises a plurality of sealing layers.

Clause 62: The method of any one of clauses 60-61, wherein the sealing layer comprises solder Clause 63: The method of any one of clauses 34-62, wherein covering the aperture comprises filling the aperture.

The following further clauses define additional preferable combinations of features. The applicant reserves the right to pursue protection for these combinations of features, and/or any other subject-matter contained in the application as filed.

Further clause 1. A detector module for defining at least a part of a wall of a vacuum chamber of a charged particle beam assessment tool, the detector module comprising: a detector configured to operate in the vacuum chamber, the detector being configured to be alignable with an incidental charged particle beam path; and a support for defining at least a part of the wall of the vacuum chamber, the support comprising a feedthrough to which the detector is mounted, wherein the detector is electrically connected through the feedthrough, wherein applied disturbances deform the support; wherein the detector module is configured so that, with disturbances to the detector and/or support, the position of the detector during operation of the detector is maintained relative to the incidental charged particle beam path.

Further clause 2. The detector module of further clause 1, wherein the detector module is configured such that disturbances of the support are symmetric relative to the incidental charged particle beam path.

Further clause 3. The detector module of either of further clauses 1 or 2, wherein the detector module comprises in part a wall of the vacuum chamber for providing a vacuum environment and the detector is positioned within the vacuum chamber.

Further clause 4. The detector module of any preceding further clause, wherein the feedthrough comprises: a first side for exposing to an atmospheric environment; and a second side for exposing to the vacuum chamber, the second side being opposite to the first side, wherein the second side is for covering an aperture in the vacuum chamber and the detector is positioned on a portion of the second side of the feedthrough that covers the aperture.

Further clause 5. The detector module of any preceding further clause, wherein the detector is positioned in a central region of the feedthrough.

Further clause 6. The detector module of any preceding further clause, wherein the detector is positioned substantially symmetrically in a plane, the plane comprising the incidental charged particle beam path and being perpendicular to the feedthrough.

Further clause 7. The detector module of any preceding further clause, further comprising a resilient member surrounding the feedthrough, wherein the resilient member is configured to move in a direction radially inwards and outwards in a plane perpendicular to the incidental charged particle beam path.

Further clause 8. The detector module of further clause 7, wherein the resilient member is configured so that during operation of the detector, deformation of the support due to disturbances is symmetric relative to the incidental charged particle beam path.

Further clause 9. The detector module of either one of further clauses 7 or 8, wherein movement of the resilient member in the circumferential direction is restricted.

Further clause 10. The detector module of any one of further clauses 7 to 9, wherein the resilient member is ring shaped.

Further clause 11. The detector module of any one of further clauses 7 to 10, wherein the resilient member is formed of a single body.

Further clause 12. The detector module of any one of further clauses 7 to 11, wherein the resilient member is formed of two or more bodies.

Further clause 13. The detector module of any one of further clauses 7 to 12, wherein the resilient member comprises a plurality of resilient members and the plurality of resilient members are positioned surrounding the feedthrough in a rotationally symmetric formation.

Further clause 14. The detector module of any one of further clauses 7 to 13, wherein one of the support or the resilient member comprises a protrusion and the other of the support or the resilient member comprises a recess configured to mate with the protrusion to prevent relative rotation between the support and the resilient member around the incidental charged particle beam path.

Further clause 15. The detector module of any one of further clauses 7 to 14, wherein the resilient member is rotationally symmetric relative to the incidental charged particle beam path.

Further clause 16. The detector module of any preceding further clause, further comprising a rigid body.

Further clause 17. The detector module of further clause 16, wherein the rigid body is on a first side of the feedthrough for exposing to an atmospheric environment.

Further clause 18. The detector module of either of further clauses 16 or 17, wherein the rigid body is configured so that during operation of the detector, deformation of the support is symmetric relative to the incidental charged particle beam path.

Further clause 19. The detector module of any one of further clauses 16 to 18, wherein the rigid body is at least part of a thermal conditioning system configured to transfer heat from the support.

Further clause 20. The detector module of further clause 19, wherein the thermal conditioning system comprises at least one supply connection through which fluid is provided during use, and at least one recovery connection through which fluid is recovered during use.

Further clause 21. The detector module of further clause 20, wherein the at least one supply connection and the at least one recovery connection are positioned in a central region of the feedthrough.

Further clause 22. The detector module of either of further clause 20 or 21, wherein the at least one supply connection and the at least one recovery connection are symmetrically positioned relative to the support.

Further clause 23. The detector module of any one of further clauses 19 to 22, wherein the thermal conditioning system defines at least part of a channel, wherein the thermal conditioning system is configured to provide conditioning fluid through the channel to transfer heat from the feedthrough.

Further clause 24. The detector module of further clause 23, wherein the channel is positioned in a central region of the feedthrough opposite the detector mounted on the other side of the feedthrough.

Further clause 25. The detector module of either one of further clauses 23 or 24, wherein a shape of the channel is substantially symmetric relative to the incidental charged particle beam path.

Further clause 26. The detector module of any one of further clauses 23 to 25, wherein a shape of the channel is substantially symmetric relative to a plane, the plane comprising the incidental charged particle beam path and being perpendicular to the feedthrough.

Further clause 27. The detector module of any one of further clauses 23 to 25, wherein the channel has a curving path, preferably comprising at least a portion that is sinusoidal, preferably wherein the path is in an S shape.

Further clause 28. The detector module of any preceding further clause, further comprising an electronics unit comprising electronics configured to be in signal communication with the detector for controlling the detector and receiving data from the detector, at least the electronics unit comprising connections to the support.

Further clause 29. The detector module of further clause 28, wherein the electronics unit is spaced apart from the support and/or the electrical connections are symmetrically positioned relative to the incidental charged particle beam path.

Further clause 30. The detector module of any one of further clauses 19 to 27, further comprising an electronics unit comprising electronics configured to be in signal communication with the detector for controlling the detector and receiving data from the detector, the electronics unit comprising connections to the support, wherein the thermal conditioning system is configured to thermally condition from the electronics unit.

Further clause 31. The detector module of further clause 30, wherein the electronics unit is spaced apart from the support and/or the electrical connections are symmetrically positioned relative to the incidental charged particle beam path.

Further clause 32. The detector module of any one of further clauses 19 to 29, wherein the thermal conditioning system comprises a support thermal conditioning system configured to transfer heat from the support and a further thermal conditioning system configured to transfer heat from another part of the detector module, and the detector module further comprises a separable portion comprising the other part and the further thermal conditioning system, the separable portion being configured to be removable from the detector module.

Further clause 33. A detector module for defining at least a part of a wall of a vacuum chamber of a charged particle beam assessment tool, the module comprising: a detector configured to operate in the vacuum chamber, the detector being configured to be alignable with an incidental charged particle beam path; a support for defining at least a part of the wall of the vacuum chamber, the support comprising a feedthrough to which the detector is mounted, wherein the detector is electrically connected through the feedthrough; a thermal conditioning system comprising a support thermal conditioning section configured to thermally condition the support and a further thermal conditioning section configured to thermally condition another part of the detector module; and a separable portion comprising the other part and the further thermal conditioning section, wherein the separable portion is configured to be removable from the detector module.

Further clause 34. The detector module of either of further clauses 32 or 33, wherein the other part is an electronics unit configured to be in signal communication with the detector for controlling the detector and receiving data from the detector, the electronics unit comprising connections to the support.

Further clause 35. The detector module of further clause 34, wherein the electronics unit is spaced apart from the support and/or the electrical connections are symmetrically positioned relative to the incidental charged particle beam path.

Further clause 36. The detector module of any one of further clauses 32 to 35, wherein the support thermal conditioning section comprises a first fluid path comprising a fluid supply duct and a fluid recovery duct, and the further thermal conditioning section comprises a second fluid path comprising at least one duct.

Further clause 37. The detector module of further clause 36, wherein the fluid supply duct and/or the fluid recovery duct are flexible.

Further clause 38. The detector module of either of further clauses 36 or 37, wherein the first fluid path and the second fluid path are provided substantially within a plane, the plane comprising the incidental charged particle beam path and being perpendicular to the feedthrough.

Further clause 39. The detector module of further clause 38, wherein the electronics unit is provided within the second fluid path in the plane.

Further clause 40. The detector module of any one of further clauses 36 to 39, wherein the first fluid path and the second fluid path are substantially symmetric relative to a plane, the plane comprising the incidental charged particle beam path and being perpendicular to the feedthrough.

Further clause 41. The detector module of any one of further clauses 36 to 40, wherein the first fluid path and the second fluid path are in fluidic communication.

Further clause 42. The detector module of any one of further clauses 36 to 41, further comprising an openable and closable valve between the first fluid path and the second fluid path.

Further clause 43. The detector module of any preceding further clause, wherein the detector and/or feedthrough and/or support is positioned within the detector module such that it is symmetric relative to the incidental charged particle beam path and/or a plane parallel to the detector and/or feedthrough.

Further clause 44. The detector module of any preceding further clause, wherein the feedthrough comprises at least one electrical connection on a surface of the feedthrough and a shape of the at least one electrical connection is symmetric in a plane, the plane comprising the incidental charged particle beam path and being perpendicular to the feedthrough.

Further clause 45. The detector module of any preceding further clauses, further comprising a magnetic shield configured to shield at least part of the detector module from magnetic fields, wherein the magnetic shield is mounted to the support.

Further clause 46. The detector module of further clause 45, further comprising an electrical shield configured to shield at least part of the detector module from electrical fields, wherein the electrical shield is mounted to the support.

Further clause 47. The detector module of any one of further clauses 1 to 44, further comprising an electrical shield configured to shield at least part of the detector module from electrical fields, wherein the electrical shield is mounted to the support.

Further clause 48. A detector module for defining at least a part of a wall of a vacuum chamber of a charged particle beam assessment tool, the module comprising: a detector configured to operate in the vacuum chamber, the detector being configured to be alignable with an incidental charged particle beam path; a support for defining at least a part of the wall of the vacuum chamber, the support comprising a feedthrough to which the detector is mounted, wherein the detector is electrically connected through the feedthrough; an electrical shield configured to shield at least part of the detector module from electrical fields, wherein the electrical shield is mounted to the support such that during operation, with applied disturbances that deform the support, the part of the detector module that is shielded by the electrical shield is maintained.

Further clause 49. The detector module of either of further clauses 47 or 48, wherein the detector comprises a detection portion configured to detect the incidental charged particle beam and another portion of the detector, and the electrical shield is configured to shield the other portion.

Further clause 50. The detector module of any one of further clauses 47 to 49, wherein the electrical shield comprises a planar portion parallel to the feedthrough, preferably an aperture is defined in the planar portion for the passage therethrough of the incidental charged particle beam path.

Further clause 51. The detector module of any one of further clauses 50, wherein the electrical shield comprises a main body comprising a cylindrical portion and the planar portion, and at least one attachment for connection of the main body to the support.

Further clause 52. The detector module of further clause 51, wherein the electrical shield has three attachments which are symmetrically positioned around the cylindrical portion relative to the incidental charged particle beam path.

Further clause 53. The detector module of any one of further clauses 47 to 52, wherein the electrical shield is rotationally symmetric relative to the incidental charged particle beam path.

Further clause 54. The detector module of any one of further clauses 47 to 53, further comprising a magnetic shield configured to shield at least part of the detector module from magnetic fields.

Further clause 55. The detector module of further clause 54, wherein at least part of the magnetic shield is positioned within the electrical shield.

Further clause 56. The detector module of either one of further clauses 54 or 55, wherein at least part of the electrical shield is positioned between the magnetic shield and the feedthrough.

Further clause 57. The detector module of any one of further clauses 54 to 56, wherein the magnetic shield comprises a cylindrical main body, preferably wherein the cylindrical main body has an axis which is substantially parallel to the incidental charged particle beam path.

Further clause 58. The detector module of further clause 57, wherein the magnetic shield comprises at least one attachment for connection of the cylindrical main body to the support, preferably wherein there are multiple attachments symmetrically positioned around the cylindrical main body relative to the incidental charged particle beam path, preferably wherein there are three attachments.

Further clause 59. The detector module of any one of further clauses 54 to 58, wherein the magnetic shield is rotationally symmetric relative to the incidental charged particle beam path.

Further clause 60. The detector module of any preceding further clause, wherein the feedthrough is a printed circuit board (PCB).

Further clause 61. A method of detecting an incidental charged particle beam in a charged particle beam inspection tool, the method comprising: a) providing a detector module, the detector module comprising: a detector configured to be alignable with an incidental charged particle beam path; and a support for defining at least a part of the wall of the vacuum chamber, the support comprising a feedthrough to which the detector is mounted, wherein the detector is electrically connected through the feedthrough, wherein applied disturbances deform the support; wherein the detector module is configured so that, with disturbances to the detector and/or support, the position of the detector during operation of the detector is maintained relative to the incidental charged particle beam path; b) providing a vacuum environment around the detector; c) providing an incidental charged particle beam for detection by the detector.

Further clause 62. The method of further clause 61, wherein the detector module comprises a resilient member surrounding the feedthrough, wherein the resilient member is configured to move in a direction radially inwards and outwards in a plane perpendicular to the incidental charged particle beam path.

Further clause 63. The method of either of further clauses 61 or 62, wherein the detector module further comprises a thermal conditioning system, and wherein the method comprises transferring heat from the support.

Further clause 64. The method of any one of further clauses 61 to 63, wherein the detector and/or feedthrough and/or support is positioned within the detector module such that it is symmetric relative to the incidental charged particle beam path and/or a plane parallel to the detector and/or feedthrough.

Further clause 65. A method of detecting an incidental charged particle beam in a charged particle beam inspection tool, the method comprising: a) providing a detector module comprising: a detector configured to operate in a vacuum chamber, the detector being configured to be alignable with an incidental charged particle beam path; a support for defining at least a part of the wall of the vacuum chamber, the support comprising a feedthrough to which the detector is mounted, wherein the detector is electrically connected through the feedthrough; a thermal conditioning system comprising a support thermal conditioning section configured to thermally condition the support and a further thermal conditioning section configured to thermally condition another part of the detector module; and a separable portion comprising the other part and the further thermal conditioning section, wherein the separable portion is configured to be removable from the detector module b) providing fluid to the support thermal conditioning section and the further thermal conditioning section; c) providing the vacuum environment around the detector; and d) providing an incidental charged particle beam for detection by the detector.

Further clause 66. A method of detecting an incidental charged particle beam in a charged particle beam inspection tool, the method comprising: a) providing a detector module comprising: a detector configured to operate in a vacuum chamber, the detector being configured to be alignable with an incidental charged particle beam path; a support for defining at least a part of the wall of the vacuum chamber, the support comprising a feedthrough to which the detector is mounted, wherein the detector is electrically connected through the feedthrough; an electrical shield configured to shield at least part of the detector module from electrical fields, wherein the electrical shield is mounted to the support such that during operation, with applied disturbances that deform the support, the part of the detector module that is shielded by the shield is maintained; b) providing the vacuum environment around the detector; c) providing an incidental charged particle beam for detection by the detector.

Further clause 67. A method of detecting an incidental charged particle beam using the detector module of any one of further clauses 1 to 60.

The invention claimed is:

1. A system for sealing a vacuum system configured to provide an atmospheric environment and a vacuum chamber environment, the system comprising:
   a printed circuit board (PCB) comprising:
      a first side for exposing to the atmospheric environment, and
      a second side for exposing to the vacuum chamber environment and for covering an aperture in the vacuum chamber environment, wherein the second side is opposite to the first side;
   a rigid body on the first side of the PCB;
   a device connected to the second side of the PCB and positioned on a portion of the PCB that covers the aperture; and
   a flexure for exposure in the vacuum chamber environment, the flexure configured to provide mechanical support to the PCB; and
   wherein the PCB is configured to provide an interface between the device within the vacuum chamber environment and the rigid body within the atmospheric environment.

2. The system of claim 1, wherein the PCB comprises SiN or alumina.

3. The system of claim 1, wherein the PCB comprises a plurality of layers.

4. The system of claim 3, wherein each layer comprises at least one of a via or a trace.

5. The system of claim 4, wherein the via does not extend through an entire length of the PCB.

6. The system of claim 1, wherein the PCB comprises a material configured to reduce a thermal resistance between the device and the PCB.

7. The system of claim 1, wherein the PCB comprises a material having a coefficient of thermal expansion that is substantially similar to a coefficient of thermal expansion of the device.

8. The system of claim 1, wherein the interface is configured to provide a thermal connection between the rigid body and the device.

9. The system of claim 1, wherein the rigid body is further configured to provide mechanical support to the PCB.

10. The system of claim 1, wherein the PCB provides a hermetic seal to the vacuum chamber environment.

11. The system of claim 1, wherein the rigid body comprises a cooling system.

12. The system of claim 1, wherein the flexure is configured to reinforce a hermetic seal provided by the PCB.

13. The system of claim 1, wherein the device is directly connected to the second side of the PCB, wherein the device comprises a detector.

14. A method for sealing a vacuum system configured to provide an atmospheric environment and a vacuum chamber environment, comprising:
   providing an interface between a device within the vacuum chamber environment and a rigid body using a printed circuit board (PCB) within the atmospheric environment, the PCB comprising:
      a first side for exposing to the atmospheric environment, and
      a second side for exposing to the vacuum chamber environment and for covering an aperture in the vacuum chamber environment, wherein the second side is opposite to the first side;
   wherein the rigid body is on the first side of the PCB and the device is connected to the second side of the PCB and positioned on a portion of the PCB that covers the aperture; and
   wherein the vacuum chamber environment includes a flexure that is configured to provide mechanical support to the PCB;
   operating the device in the vacuum system.

15. The method of claim 14, wherein the interface is configured to provide a thermal connection between the rigid body and the device.

16. The method of claim 14, wherein the rigid body is further configured to provide mechanical support to the PCB.

17. The method of claim 14, wherein the PCB provides a hermetic seal to the vacuum chamber environment, wherein the rigid body is further configured to reinforce the hermetic seal provided by the PCB.

18. The method of claim 14, wherein the flexure is configured to reinforce a hermetic seal provided by the PCB.

* * * * *